(12) United States Patent
Osaka et al.

(10) Patent No.: US 7,939,907 B2
(45) Date of Patent: May 10, 2011

(54) SEMICONDUCTOR DEVICE INCLUDING A DIGITAL SEMICONDUCTOR ELEMENT AND AN ANALOG SEMICONDUCTOR ELEMENT IN A COMMON SEMICONDUCTOR DEVICE

(75) Inventors: Hideki Osaka, Kokubunji (JP); Yutaka Uematsu, Hachioji (JP); Eiichi Suzuki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 482 days.

(21) Appl. No.: 11/755,045

(22) Filed: May 30, 2007

(65) Prior Publication Data
US 2007/0289771 A1    Dec. 20, 2007

(30) Foreign Application Priority Data
Jun. 2, 2006   (JP) .................. 2006-155136

(51) Int. Cl.
*H01L 29/00* (2006.01)
*H01L 23/52* (2006.01)
(52) U.S. Cl. .................. 257/500; 257/691
(58) Field of Classification Search .......... 257/207, 257/208, 500, 502, 503, 691, E25.011, E25.012, 257/25.025
See application file for complete search history.

(56) References Cited

U.S. PATENT DOCUMENTS

| | | | |
|---|---|---|---|
| 5,336,915 A * | 8/1994 | Fujita et al. | 257/369 |
| 5,491,358 A * | 2/1996 | Miyata | 257/546 |
| 5,608,264 A | 3/1997 | Gaul | |
| 5,994,741 A * | 11/1999 | Koizumi et al. | 257/355 |
| 6,303,997 B1 | 10/2001 | Lee | |
| 7,472,747 B1 | 1/2009 | Bazarjani et al. | |
| 2006/0043556 A1 | 3/2006 | Su et al. | |
| 2006/0092093 A1 | 5/2006 | Choi et al. | |

FOREIGN PATENT DOCUMENTS

| | | |
|---|---|---|
| JP | 2004-241426 | 8/2004 |
| JP | 2004-259959 | 9/2004 |

OTHER PUBLICATIONS

Madhavan Swaminathan, et al.; Power Distribution Networks for System-on-Package: Status and Challenges; IEEE Transactions on Advanced Packaging; May 2004; pp. 286-300; vol. 27, No. 2.
Taiwanese Office Action in Appln. No. 09920610300 [dated Aug. 27, 2010] (10 pgs).

* cited by examiner

*Primary Examiner* — Hung Vu
(74) *Attorney, Agent, or Firm* — Antonelli, Terry, Stout & Kraus, LLP.

(57) ABSTRACT

High density mounting and power source sharing are achieved by a digital semiconductor element and an analog semiconductor element provided in a common semiconductor device. A power layer for analog operation is connected to one end of an EBG (Electromagnetic Band Gap) layer, a power layer for digital operation is connected to the other end of the EBG layer, ground terminals for the respective elements are connected to a common ground layer, and a ground layer for separating the power layer for analog operation and the EBG layer from each other is disposed between the power layer for analog operation and the EBG layer. Thereby, high density mounting is achieved along with reducing interference of the power source to an analog chip.

10 Claims, 21 Drawing Sheets

SEMICONDUCTOR DEVICE INCLUDING A DIGITAL SEMICONDUCTOR ELEMENT AND AN ANALOG SEMICONDUCTOR ELEMENT IN A COMMON SEMICONDUCTOR DEVICE

CROSS-REFERENCE TO RELATED APPLICATION

The present application claims priority from Japanese Patent Application No. JP 2006-155136 filed on Jun. 2, 2006, the content of which is hereby incorporated by reference into this application.

TECHNICAL FIELD OF THE INVENTION

Present invention relates to a semiconductor device, and in particular to an effective technique in application to a semiconductor device having an analog semiconductor element and a digital semiconductor element.

BACKGROUND OF THE INVENTION

In a portable electronic device such as GPS (Global Positioning System) or wireless LAN (Local Area Network), it is required to combine a wireless technique and a high-density mounting technique. And therefore, a demand for mounting an analog semiconductor element and a digital semiconductor element so as to be close to each other or on one package is increasing. A technique for mounting an analog semiconductor element and a digital semiconductor element on the same board to integrate them in one module and a technique adopting an EBG (Electromagnetic Band Gap) layer as a ground plane of the board are described in "M.Swaminathan et al., "PowerDistribution Networks for System-on-Package: Status and Challenges", IEEE Transactions on Advanced Packaging, Vol. 27, No. 2, May 2004" (Non-Patent Document 1).

And, there is a technique of reducing influence of mismatching of characteristic impedance caused by electromagnetic coupling generated between a signal through conductor and a grounding conductor layer having an opening arranged so as to surround the signal through conductor (for example, see Japanese Patent Application Laid-Open Publication No. 2004-259959 (Patent Document 1)).

Furthermore, there is a technique of relaxing mismatching of characteristic impedance at a connection portion between a signal wiring conductor and a signal through conductor and preventing noise interference between the signal wiring conductors (for example, see Japanese Patent Application Laid-Open Publication No. 2004-241426 (Patent Document 2)).

SUMMARY OF THE INVENTION

Since a digital semiconductor element handles "0" and "1", power source noise generated therefrom expands to a wide band and a frequency thereof extends to an RF (radio frequency) band with speed-up on every generations. However, a noise band required by an analog RF signal is considerably low (for example, −120 dBm in GPS). It is a problem that, because of transmission/reception of the analog RF signal and interference of noise generated from the digital semiconductor element, it is difficult for the analog semiconductor element and the digital semiconductor element to share a power source and mount the analog semiconductor element and the digital semiconductor element so as to be close to each other.

That is, since interference of power source noise from the digital semiconductor element to the analog semiconductor element exists, it is difficult to constitute a power source for the digital semiconductor element and for the analog semiconductor element as a common power source and realize proximity mounting for high-density mounting.

Even if the EBG wiring is adopted for reduction of noise coupling between the analog semiconductor element and the digital semiconductor element, effect of noise cut-off depends on an arrangement of both the elements, a structure around the EGB wiring and the like. Especially, in order to realize high-density mounting as a whole module structure and reduce the noise coupling to an acceptable level, the arrangement of the analog semiconductor element and the digital semiconductor element and the structure around the EGB wiring must be devised.

An object of the present invention is to provide a technique for achieving a common power source for the digital semiconductor element and the analog semiconductor element in the semiconductor device and realizing high-density mounting.

Another object of the present invention is to provide a technique capable of securing quality of signals in the semiconductor device and achieving stabilization of a power source.

The above-described and other objects and novel characteristics of the present invention will become apparent from the description of the specification and the attached drawings.

An outline of typical elements of the invention disclosed in this application is described briefly as follows.

That is, a semiconductor device according to the present invention includes a digital semiconductor element, an analog semiconductor element, a wiring board mounted with the digital semiconductor element and the analog semiconductor element, and an external terminal connected to the wiring board. The wiring board includes an EBG layer in which two wiring patterns having different impedances are defined as a unit wiring pattern and a plurality of the unit wiring patterns is disposed on a flat plane, a ground layer, a power layer for the digital element connected to one end of the EBG layer, and a power layer for the analog element connected to the other end of the EBG layer. Furthermore, a ground connection terminal for the digital semiconductor element and a ground connection terminal for the analog semiconductor element are connected to the ground layer of the wiring board, a power connection terminal for the digital semiconductor element is connected to the power layer for the digital element of the wiring board, and a power connection terminal for the analog semiconductor element is connected to the power layer for the analog element of the wiring board.

And, the semiconductor device according to the present invention includes the digital semiconductor element, the analog semiconductor element, the wiring board mounted with the digital semiconductor element and the analog semiconductor element, and the external terminal connected to the wiring board. The wiring board includes the EBG layer in which a plurality of unit wiring patterns each of which are composed of a combination of two wiring patterns having different areas are arranged regularly on the flat plane, the ground layer, the power layer for the digital element connected to one end of the EBG layer, and the power layer for the analog element connected to the other end of the EBG layer. Furthermore, the ground connection terminal for the digital semiconductor element and the ground connection terminal for the analog semiconductor element are connected to the ground layer of the wiring board, the power connection terminal for the digital semiconductor element is connected to the power layer for the digital element of the wiring board, and the power connection terminal for the analog semiconductor element is connected to the power layer for the analog element of the wiring board.

And, the semiconductor device according to the present invention includes the digital semiconductor element, the analog semiconductor element, the wiring board mounted with the digital semiconductor element and the analog semiconductor element, and the external terminal connected to the wiring board. The wiring board includes two EBG layers in which two wiring patterns having different impedances are defined as a unit wiring pattern and a plurality of the unit wiring patterns is disposed on a flat plane. One EBG layer is for ground and the other is for power source. Furthermore, one end of the EBG layer for ground (the first EBG layer) is connected to a ground layer for the digital element and the other end is connected to a ground layer for the analog element. One end of the EBG layer for power (the second EBG layer) is connected to the power layer for the digital element and the other end is connected to the power layer for the analog element. And, the ground connection terminal for the digital semiconductor element is connected to the ground layer for the digital element of the wiring board, the ground connection terminal for the analog semiconductor element is connected to the ground layer for the analog element of the wiring board, the power connection terminal for the digital semiconductor element is connected to the power layer for the digital element of the wiring board, and the power connection terminal for the analog semiconductor element is connected to the power layer for the analog element of the wiring board.

Effect obtained by the typical elements of the invention disclosed in this application is described briefly as follows.

Since the power layer for the analog element of a printed board is connected to one end of the EBG layer, the power layer for a digital element is connected to the other end, the ground connecting terminals for the respective elements are connected to a common ground layer, and a ground layer for separating the power layer for the analog element and the EBG layer from each other is arranged therebetween, high-density mounting can be achieved while reducing interference of power source noise to the analog semiconductor element.

BRIEF DESCRIPTIONS OF THE DRAWINGS

DESCRIPTIONS OF THE PREFERRED EMBODIMENTS

In the following embodiments, in principle, the same or similar portions are not repeatedly explained unless particularly necessary.

And, in the following embodiments, if necessary for convenience, the invention is described with a plurality of sections or embodiments in a divided manner. However, unless explicitly mentioned, these sections or embodiments are not unrelated to one another. One is a modification example, a detail, a supplement, or the like of all or part of the others.

Furthermore, in the following embodiments, when the number of elements and others (including the numbers, numerical values, amounts, ranges, and the like) are referred to, such number is not restricted to a specific number, and can be above or below the specific number, unless explicitly mentioned or the number is apparently restricted to the specific number according to the principle.

The embodiments of the present invention are described in detail below based on the drawings. Note that, in all drawings for explaining the embodiments, members having the same function are provided with the same reference symbols, and repeated explanation of such members is omitted.

First Embodiment

Figure 1:
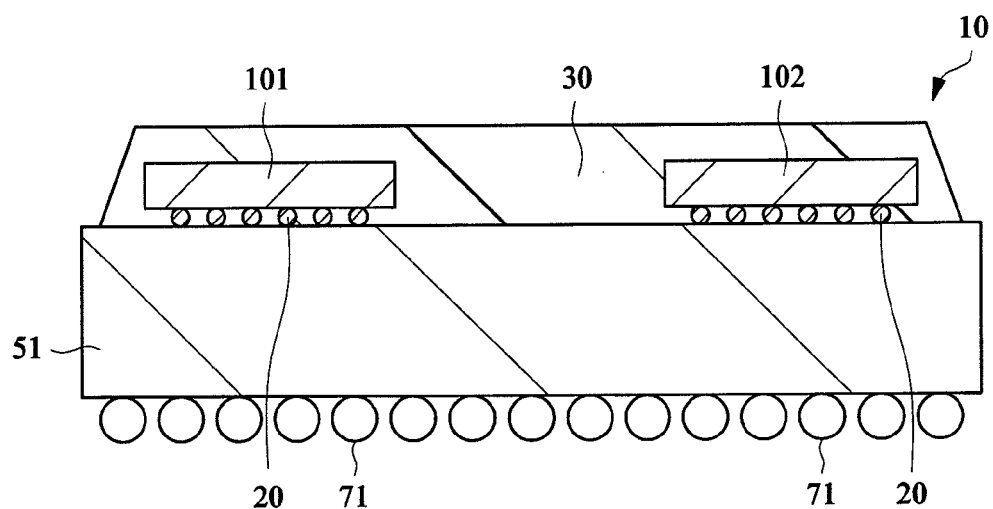
FIG. 1 is a cross-sectional diagram showing one example of a structure of a semiconductor device according to a first embodiment of the present invention.
Figure 2:
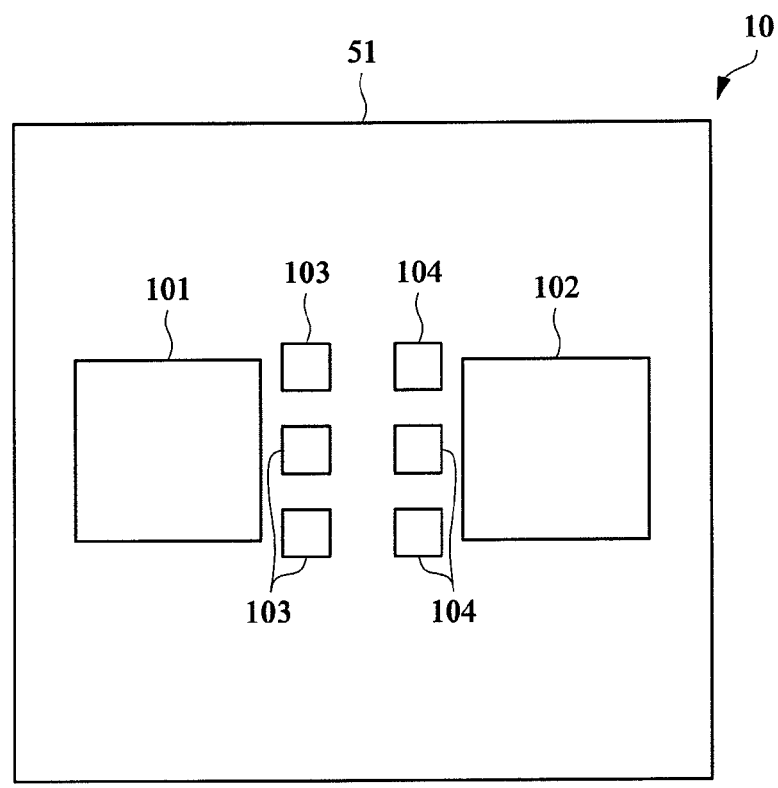
FIG. 2 is a plan diagram showing one example of a mounting layout of parts in the semiconductor device shown in FIG. 1.
Figure 3:
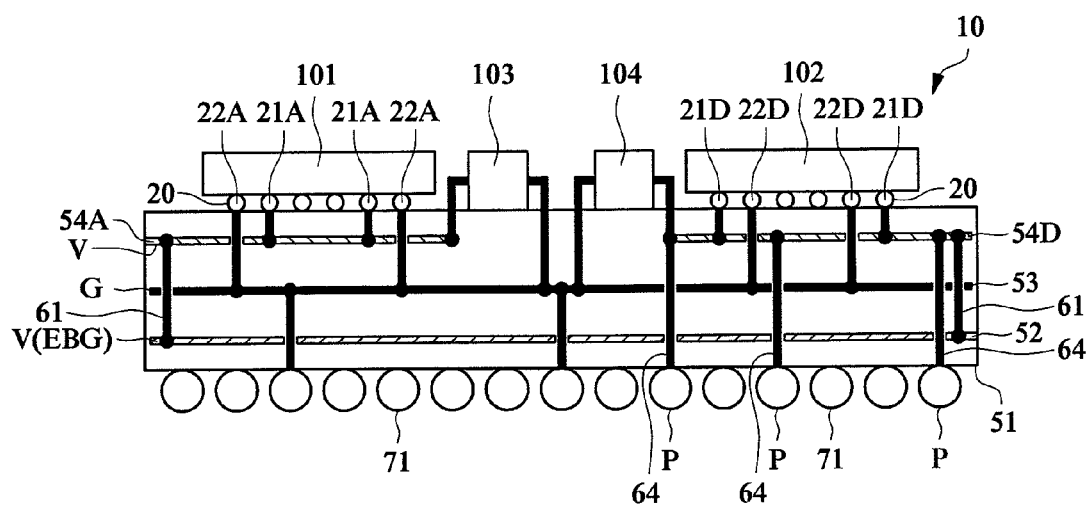
FIG. 3 is a structural diagram showing one example of routing of inner wire over a package board of the semiconductor device shown in FIG. 1.
Figure 4:
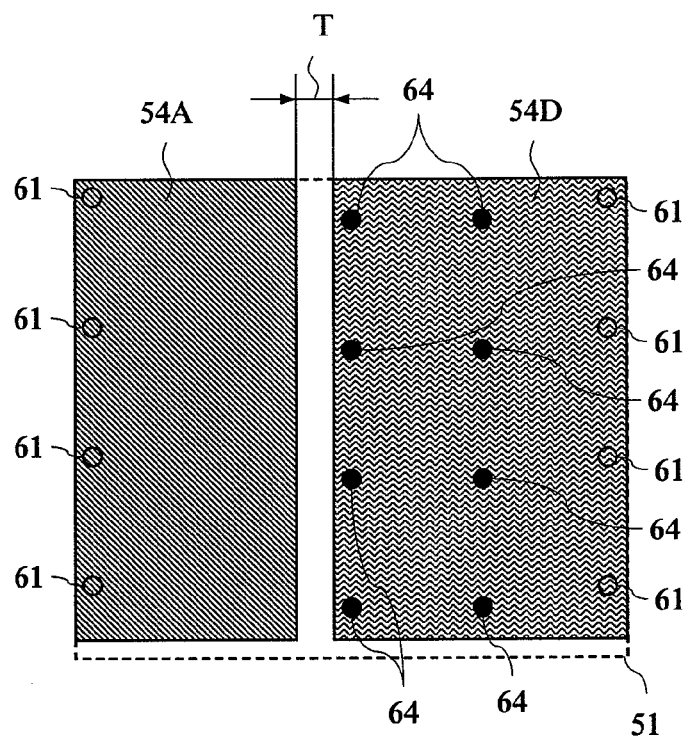
FIG. 4 is a plan diagram showing one example of a structure of a power layer for an analog element and a power layer for a digital element provided over the package board of the semiconductor device shown in FIG. 1.
Figure 5:
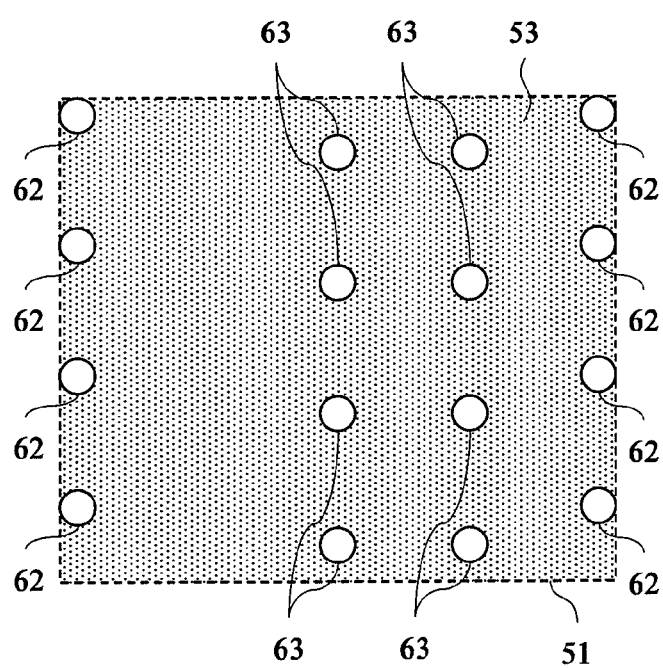
FIG. 5 is a plan diagram showing one example of a structure of a ground layer provided over the package board of the semiconductor device shown in FIG. 1.
Figure 6:
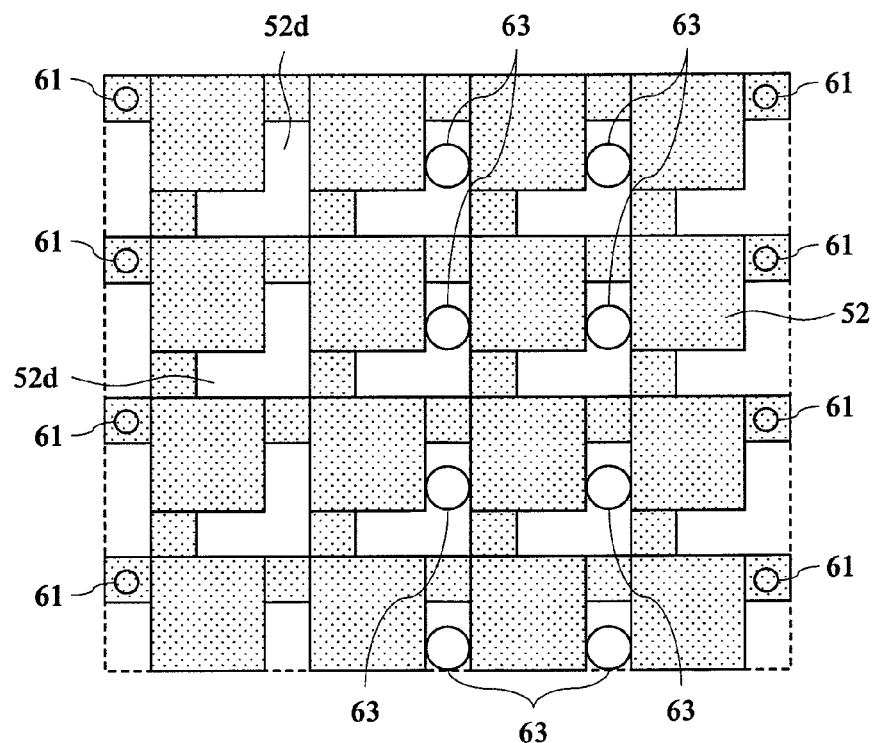
FIG. 6 is a plan diagram showing one example of a structure of an EBG layer provided over the package board of the semiconductor device shown in FIG. 1.
Figure 7:
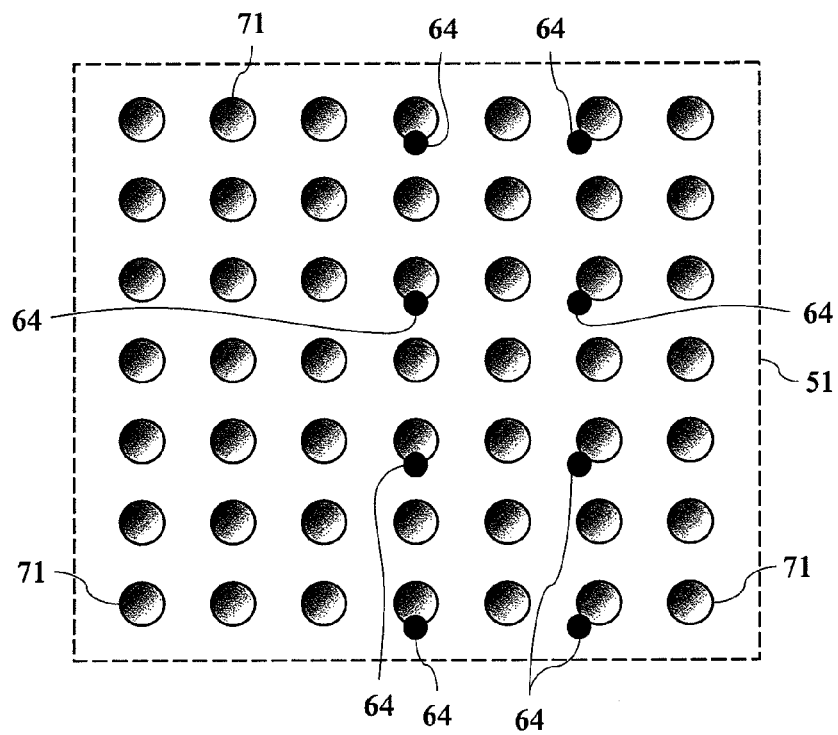
FIG. 7 is a back diagram showing one example of an arrangement state of external terminals of the semiconductor device shown in FIG. 1.
Figure 8:
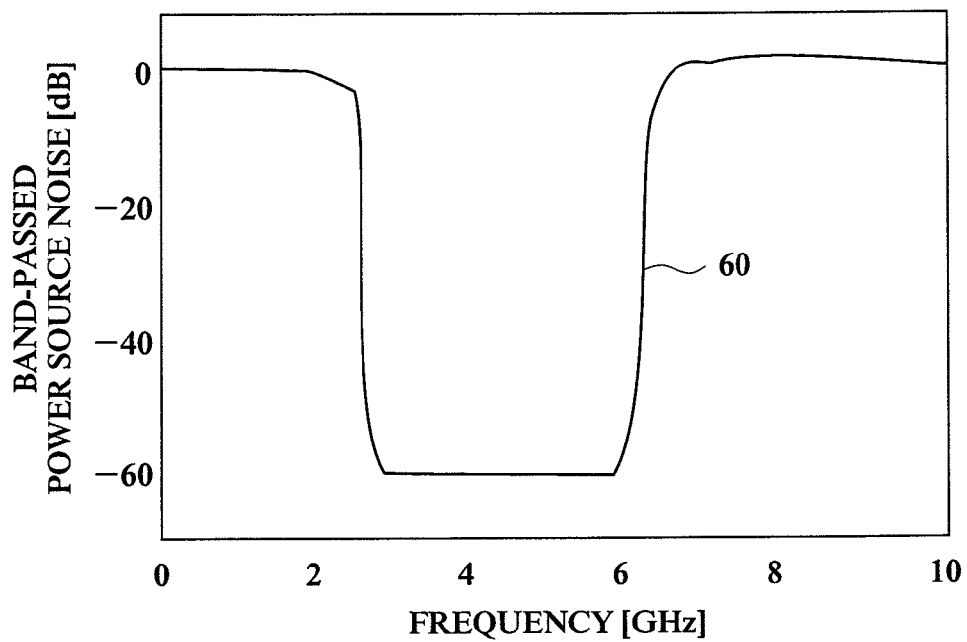
FIG. 8 is a characteristic diagram showing one example of a relationship between a frequency and a power source noise in the semiconductor device according to the first embodiment of the present invention.
Figure 9:
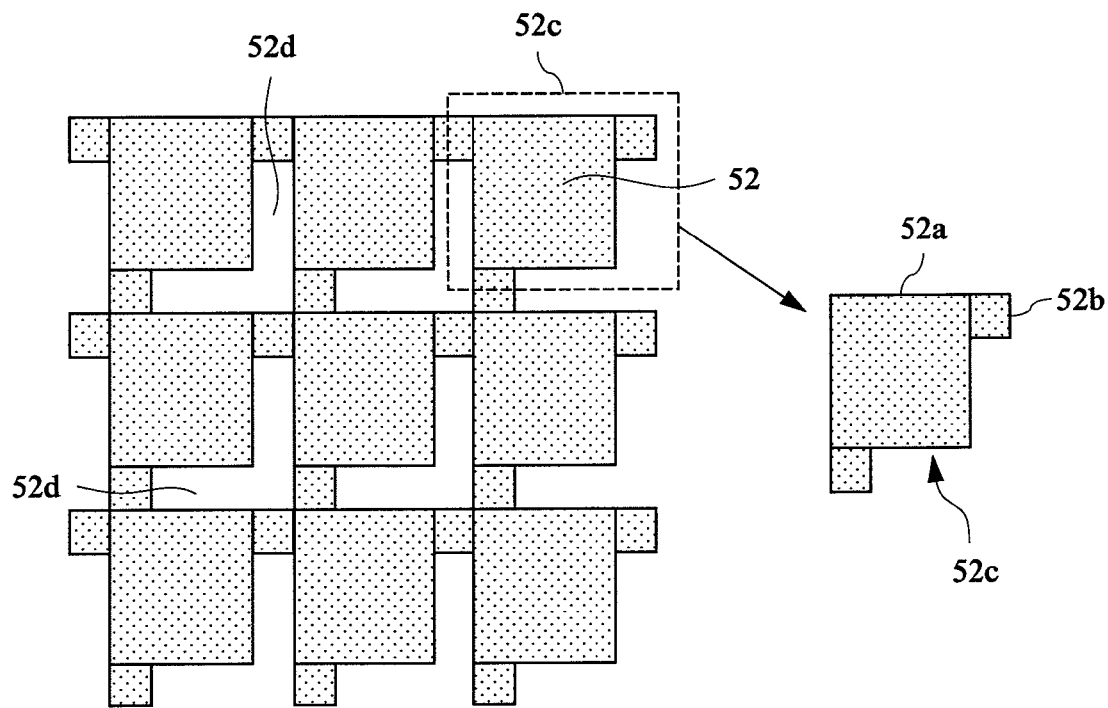
FIG. 9 is a plan diagram showing one example of a structure of the EBG layer and a unit wiring pattern provided over the package board of the semiconductor device shown in FIG. 1.
Figure 10:
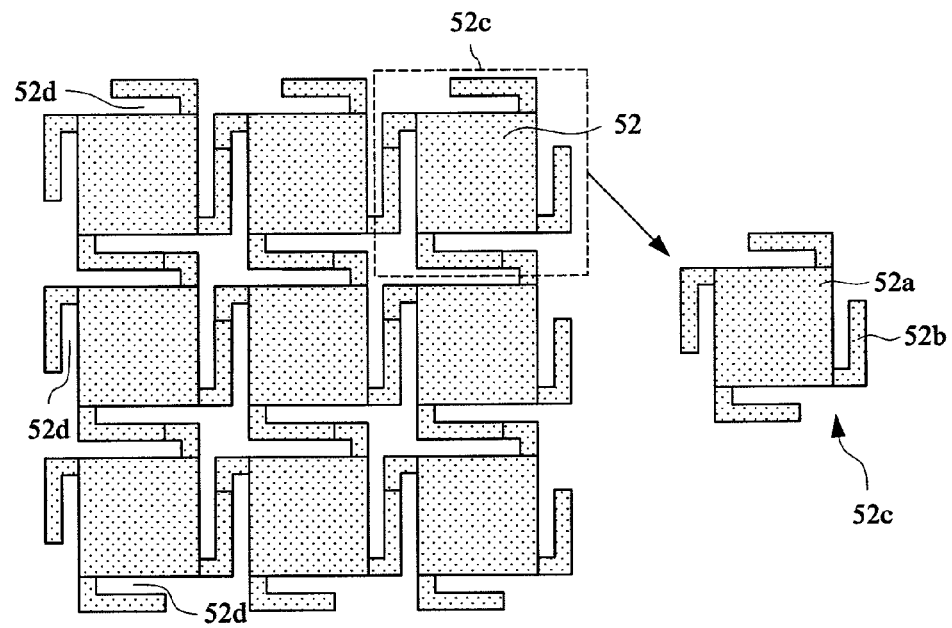
FIG. 10 is a plan view showing structure of an EBG layer and a unit wiring pattern in modification example of the first embodiment of the present invention.
Figure 11:
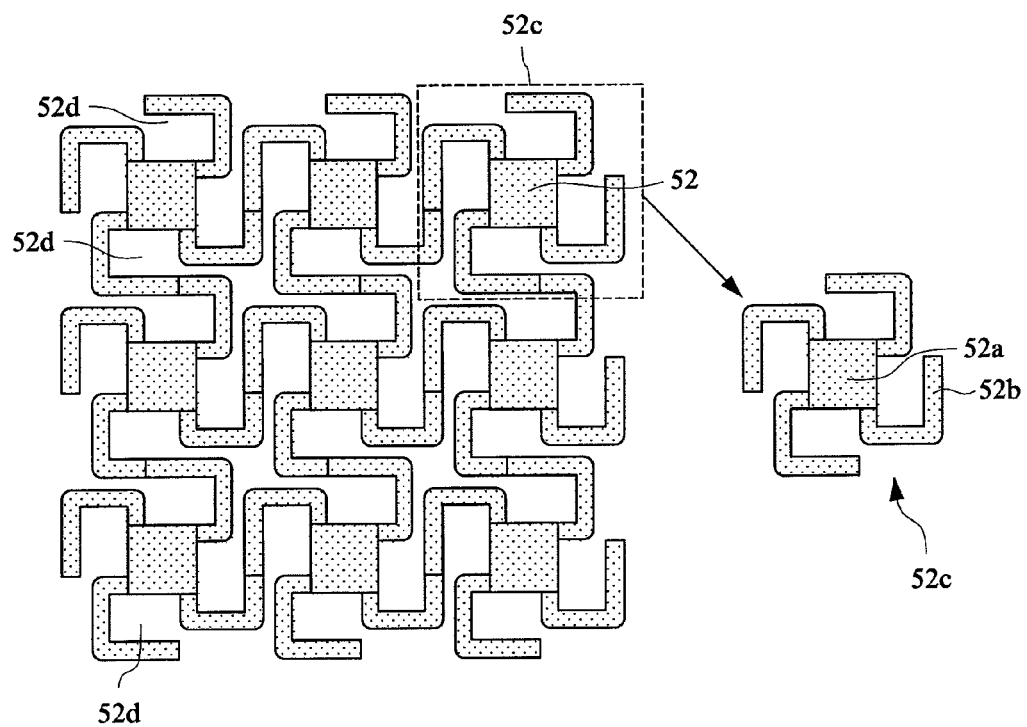
FIG. 11 is a plan view showing structure of an EBG layer and a unit wiring pattern in another modification example of the first embodiment of the present invention.

FIG. 1 is a cross-sectional diagram showing one example of a structure of a semiconductor device according to a first embodiment of the present invention, FIG. 2 is a plan diagram showing one example of a mounting layout of parts in the semiconductor device shown in FIG. 1, and FIG. 3 is a structural diagram showing one example of routing of inner wire over a package board of the semiconductor device shown in FIG. 1. And, FIG. 4 is a plan diagram showing one example of a structure of a power layer for an analog element and a power layer for a digital element provided over the package board of the semiconductor device shown in FIG. 1, FIG. 5 is a plan diagram showing one example of a structure of a ground layer provided over the package board of the semiconductor device shown in FIG. 1, FIG. 6 is a plan diagram showing one example of a structure of an EBG layer provided over the package board of the semiconductor device shown in FIG. 1, and FIG. 7 is a back diagram showing one example of an arrangement state of external terminals of the semiconductor device shown in FIG. 1. Furthermore, FIG. 8 is a characteristic diagram showing one example of a relationship between a frequency and a power source noise in the semiconductor device according to the first embodiment of the present invention, FIG. 9 is a plan diagram showing one example of a structure of the EBG layer and a unit wiring pattern provided over the package board of the semiconductor device shown in FIG. 1, and FIGS. 10 and 11 are plan diagrams showing structures of an EBG layer and a unit wiring pattern in modification examples respectively.

The semiconductor device according to the first embodiment is, as shown in FIG. 1, a semiconductor package mounted with an analog chip 101 that is an analog semiconductor element and a digital chip 102 that is a digital semiconductor element on a wiring board. In the first embodiment, as one example of the semiconductor package, a resin-encapsulated SIP (System In Package) 10 in which the analog chip 101 of an analog system and the digital chip 102 of a digital system are mounted over a package board 51 that is the wiring board in a mixed manner will be explained.

Figure 23:
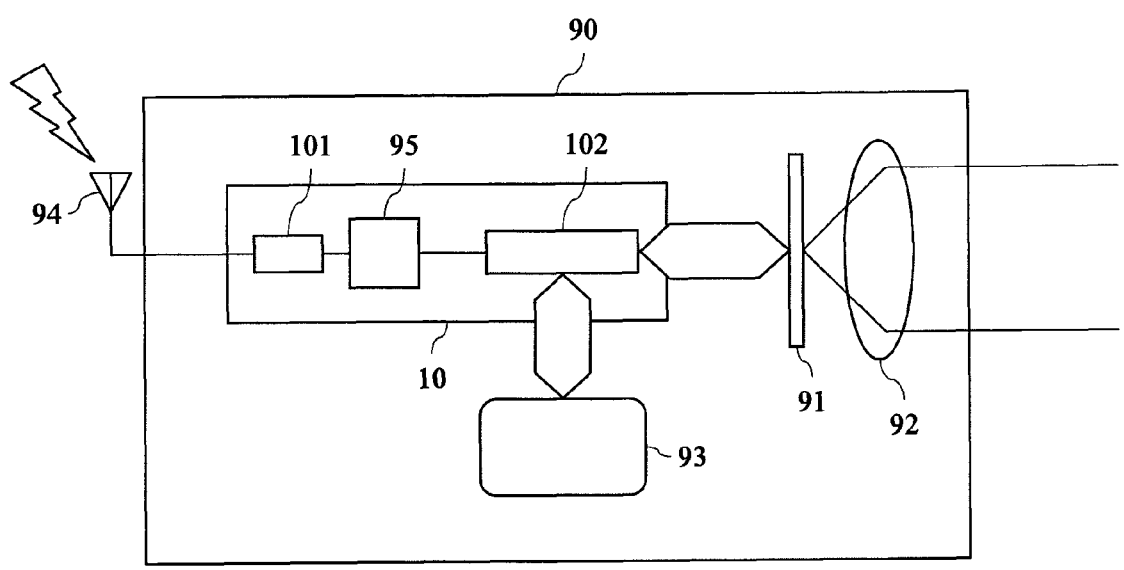
FIG. 23 is a block diagram showing one example of use of a semiconductor device according to a seventh embodiment of the present invention.

The analog chip 101 mounted over a main face of the package board 51 is, for example, of an RF type and it is connected with an antenna 94 to perform transmission/reception of an electrical wave as shown in FIG. 23. On the other hand, the digital chip 102 similarly mounted over the main face of the package board 51 is, for example, a microprocessor or the like, and it controls various processing.

As shown in FIG. 1, the analog chip 101 and the digital chip 102 are connected to the package board 51 in a flip-chip manner via bumps (connection terminals) 20 with respective main faces thereof directed to the package board 51. And, the analog chip 101 and the digital chip 102 are encapsulated over the package board 51 by an encapsulating member 30 made of encapsulating resin.

And, over a back face of the package board 51 of the SIP 10, as shown in FIG. 7, a plurality of solder balls 71 that are external terminals are arranged in a grid manner and the SIP 10 is also a semiconductor package of a BGA (Ball Grid Array) type. Note that, respective balls of the plurality of solder balls 71 correspond to respective connection terminals of the analog chip 101 and the digital chip 102, and electrically connected to the connection terminals via internal wires of the board 51. Accordingly, the analog chip 101 and the digital chip 102 perform transmission/reception of signals with the outside via the solder balls 71 corresponding and electrically connected thereto.

In the SIP 10 according to the first embodiment, as shown in FIG. 3, an EBG layer 52 in which two wiring patterns having different impedances are defined as a unit cell (unit wiring pattern) 52c shown in FIG. 9 and a plurality of unit cells 52c are arranged on a flat plane is formed inside the package board 51. Furthermore, a power layer for digital (the power layer for the digital element) 54D connected to one end of the EBG layer 52, a power layer for analog (the power layer for the analog element) 54A connected to the other end of the EBG layer 52 on the opposite side, and the ground layer 53 are formed inside the package board 51. Note that, the power layer for digital 54D and the power layer for analog 54A are arranged on the same wiring layer.

That is, the power layer for digital 54D and the power layer for analog 54A are electrically connected via the EBG layer 52. At this time, the power layer for digital 54D is connected to the EBG layer 52 at one end of the EBG layer 52 via an EBG connection viahole (viahole connection) 61, on the other hand, the power layer for analog 54A is similarly connected to the EBG layer 52 at the other end of the EBG layer 52 at the opposite side via the EBG connection viahole 61. That is, the power layer for digital 54D and the power layer for analog 54A are respectively connected in a DC manner by the viahole connection (the EBG connection viahole 61) disposed at both ends of the EBG layer 52, but they are blocked from each other at a specific high frequency band.

And, as shown in FIG. 3, the ground layer 53 that is a ground wiring layer (G) is disposed between the power layer for analog 54A and the EBG layer 52, and the power layer for analog 54A is disposed nearer the analog chip 101 than the EBG layer 52. That is, the ground layer 53 which separates the power layer for analog 54A and the EBG layer 52 is disposed between the power layer 54A and the EBG layer 52, and the analog chip 101 is disposed near the power layer for analog 54A. Since the ground layer 53 is disposed between the power layer for analog 54A and the EBG layer 52, electric coupling between the power layer for analog 54A and the EBG layer 52 is suppressed so that leakage of noise power can be prevented.

Next, FIG. 4 is a diagram showing a power layer (V). As shown in FIG. 4, the power layer for digital 54D and the power layer for analog 54A are arranged on the same wiring layer, and an area of the power layer for digital 54D is larger than that of the power layer for analog 54A. This is because the digital chip 102 performs processing faster than the analog chip 101 and generates a larger amount of noise. By enlarging the area of the power layer for digital, stabilization of a power source can be achieved.

Furthermore, an interval with a length of T or more is formed between the power layer for digital 54D and the power layer for analog 54A, so that interference of power source noise can be suppressed. T is, for example, 1 mm and if T is less than 1 mm, it is difficult to suppress interference of power source noise caused by electric coupling of both sides.

And, a plurality of EBG connection viaholes 61 is connected to an outer end portion of the power layer for digital 54D, and a plurality of digital power source connection viaholes (viahole connections) 64 is connected to an inner end portion thereof and the vicinity of a central portion thereof. On the other hand, a plurality of EBG connection viaholes 61 is connected to an outer end portion of the power layer for analog 54A.

Next, FIG. 5 is a diagram showing the ground layer (G). As shown in FIG. 5, the ground layer 53 is a large area pattern formed to have an area (size) approximately equal to that of the package board 51, and a plurality of anti-pads (holes) 62 and a plurality of anti-pads (holes) 63 are formed in the large area pattern. The EBG connection viaholes 61 extend through areas of the anti-pads 62 to connect upper and lower layers of the ground layer 53 without connecting with the ground layer 53. The plurality of EBG connection viaholes anti-pads 62 is formed on both end portions of the ground layer 53, and the power source connection viahole anti-pads 63 are formed on portions inner of the EBG connection viaholes anti-pads 62. Note that, the viaholes 61 and 64 inside the anti-pads 62 and 63 are omitted in FIG. 5 and FIG. 6 for easy viewing.

Next, FIG. 6 is a diagram showing an EBG layer (V(EBG)). As shown in FIG. 6, the plurality of EBG connection viaholes 61 is formed on both ends of the EBG layer 52, and the plurality of power source connection viahole anti-pads 63 is formed on an inner portion of the EBG connection viaholes 61. That is, in the package board 51 of the SIP 10 according to the first embodiment, since the EBG layer 52 is formed over the whole the package board 51 in a flat face direction so as to have an area approximately equal to that of the package board 51 and the EBG connection viaholes 61 connected to the power layer for digital 54D or the power layer for analog 54A are connected to both ends of the EBG layer 52, noise shielding effect to power source noise can be increased by using the EBG pattern with the longest possible distance.

Thus, the power layer for digital 54D and the EBG layer 52 are connected via the EBG connection viaholes 61 at one end of the EBG layer 52, on the other hand, the power layer for analog 54A and the EBG layer 52 are connected via the EBG connection viaholes 61 at the other end of the EBG layer 52. At this time, the EBG connection viaholes 61 connect upper and lower layers of the ground layer 53 through a region of the anti-pads 62 of the ground layer 53.

Furthermore, the power layer for digital 54D and the solder balls 71 corresponding thereto and serving as external terminals shown in FIG. 7 are directly connected via the digital power source connection viaholes 64 extending through the power source connection viahole anti-pads 63 formed on the ground layer 53 and the anti-pads 63 formed on the EBG layer 52. That is, the power layer for digital 54D is directly connected to the solder balls 71 via the digital power source connection viaholes 64 without utilizing the EBG layer 52, on the other hand, the power layer for analog 54A is connected to the solder balls 71 via the EBG layer 52. Accordingly, when the SIP 10 is mounted on the printed board 80 shown in FIG. 22, the power layer for digital 54D of the SIP 10 is connected to a power layer 82 that is a power source layer of the printed board 80 via the digital power source connection viaholes 64 and the solder balls 71.

Note that, as shown by a "P" portion in FIG. 3, in the SIP 10, power supplying to the power layer for digital 54D is performed from the solder balls 71 via the digital power source connection viaholes 64, and power supplying to the power layer for analog 54A is performed in a way that after passing through the power layer for digital 54D, a power is conducted to the EBG layer 52 via the EBG connection viaholes 61 at the end portion thereof, goes through the EBG layer 52 one end to the other end. And then, the power is supplied to the power layer for analog 54A via the EBG connection viaholes 61 at the other end on the opposite side.

Ground connection terminals 22D of the digital chip 102 and ground connection terminals 22A of the analog chip 101 are connected to the ground layer 53 that is the same ground layer (G), respectively.

That is, the connection terminals of the digital chip 102 and the ground connection terminals of the analog chip 101 are connected to the common ground layer 53.

Furthermore, power connection terminals 21D of the digital chip 102 are connected to the power layer for digital 54D, on the other hand, power connection terminals 21A of the analog chip 101 are connected to the power layer for analog 54A.

Next, a structure and a characteristic of the EBG layer 52 will be explained.

The EBG layer 52 is, as shown in FIG. 9, configured by defining two wiring patterns having different impedances as a unit cell (unit wiring pattern) 52c and arranging a plurality of the unit cells 52c on a flat plane cyclically or regularly. For example, by forming the unit cell 52c from a first wiring pattern 52a and a second wiring pattern 52b that are different in area (size) from each other and arranging a plurality of unit cells 52c cyclically or regularly, a band gap (characteristic cutting off power source noise at a specific frequency band) 60 shown in FIG. 8 is obtained as a passage characteristic of the power source. In an example of the band gap 60 shown in FIG. 8, power is cut off in a frequency range of about 3 to 6 GHz, and power, namely, energy is attenuated to −60 dB to be prevented from conducting from the power layer for digital 54D to the power layer for analog 54A.

Next, a mechanism of occurring the cut-off frequency (band gap) 60 will be explained. The reason why the cutting-off of power at the EBG layer 52 occurs is as follows: Gaps (slits) 52d are formed in the power layer in the EBG pattern, as shown in FIG. 9, and a resonant mode is not caused at a resonant frequency corresponding to a loop of a current flowing in the EBG power layer because of the gaps 52d. On the contrary, the resonant mode is caused at a resonant frequency corresponding to a node of the current. Since the two frequencies are different, a frequency that can pass through and a frequency that can not pass through are generated. Setting of these frequencies can be performed by a physical size of the EBG pattern, materials with a different relative permittivity, or a combination of impedance of the unit cell 52c and a transmission time.

For example, in the EBG pattern of the EBG layer 52 shown in FIG. 9, a wiring pattern obtained by combining a first wiring pattern 52a with a large square shape and a second wiring pattern 52b with a small square shape is defined as a unit cell (unit wiring pattern) 52c and the unit cells 52c are arranged cyclically or regularly. Since the first wiring pattern 52a with a large square shape has low impedance with respect to the ground layer, on the other hand, the second wiring pattern 52b with a small square shape has high impedance with respect to the ground layer, a structure in which two wiring patterns having different impedances are cyclically arranged can be obtained.

In a modification example shown in FIG. 10, the second wiring pattern 52b of the two wiring patterns different in area in the EBG layer 52 is formed in an L shape, so that the L-shaped second wiring pattern 52b can be connected to a unit cell 52c positioned adjacent thereto. As a result, inductance of the second wiring pattern 52b can be increased, and therefore, larger impedance can be obtained with the area equal to that of the unit cell 52c shown in FIG. 9. Accordingly, in the case of the EBC layer 52 shown in FIG. 10, even if the area thereof is equal to that of the EBG layer 52 shown in FIG. 9, a cut-off frequency can be changed. Alternatively, in the EBG layer 52 shown in FIG. 10, a cut-off characteristic can be realized even at a frequency equal to that in the EBG layer 52 shown in FIG. 9 with smaller area.

And, in the EBG layer 52 of a modification example shown in FIG. 11, by making the L-shaped second wiring pattern 52b longer, the effect obtained in the EBG layer 52 of FIG. 10 can be increased further.

Next, in the SIP 10, as shown in FIG. 2 and FIG. 3, a decoupling capacitor (capacitor element) 103 is connected between the power layer for analog 54A and the ground layer 53. That is, the analog decoupling capacitor 103 electrically connecting the power layer for analog 54A and the ground layer 53 is mounted on the package board 51. And therefore, reinforcement and stabilization of power source for analog can be achieved. Furthermore, a decoupling capacitor 104 electrically connecting the power layer for digital 54D and the ground layer 53 is mounted on the package board 51.

According to the SIP 10 of the first embodiment, in the semiconductor device in which the analog chip 101 of analog system and the digital chip 102 of digital system are mounded over the package board 51 in a mixing manner, high density mounting can be achieved with reducing interference of power source. That is, in the SIP 10, the power layer for analog 54A is connected to the one end of the EBG layer 52 of the package board 51, the power layer for digital 54D is connected to the other end thereof, and grounding connection terminals for respective element are connected to the ground layer 53 in common. Furthermore, the ground layer 53 separating the power layer for analog 54A and the EBG layer 52 from each other is provided between the power layer for analog 54A and the EBG layer 52, and the power layer for analog 54A is arranged at a position far from the EBG layer 52.

Accordingly, since the ground layer 53 is provided between the power layer for analog 54A and the EBG layer 52 and the power layer for analog 54A is arranged at a position far from the EBG layer 52, electric coupling between the EBG layer and the power layer for analog 54A is suppressed so that leakage of noise can be prevented. Furthermore, since the EBG layer 52 can be used with a maximum length approximately equal to that of the package board 51, the noise cut-off characteristic can be further improved.

As a result, in the SIP (semiconductor device) 10, high density mounting can be realized with reducing interference of power source noise to the analog chip 101.

Furthermore, since the interference of power source to the analog chip 101 can be reduced, stabilization of power source can be achieved with securing quality of signals in the SIP 10.

Since the present embodiment can be realized by only changing wiring pattern including the EBG layer 52 in the package board 51, reduction of interference of power source and high-density mounting can be realized at low cost without requiring excess parts.

Note that, as described above, in the SIP 10 according to the present embodiment, the maximal effect is obtained by interposition of the EGB layer having a length approximating that of the package board. On the other hand, since only interposition of an EBG pattern with a length sufficient to obtain a required noise cut-off effect is required, the effect of the present invention can be obtained even in a structure in which only a partial region of the package board is served as the EBG layer.

Second Embodiment

Figure 12:
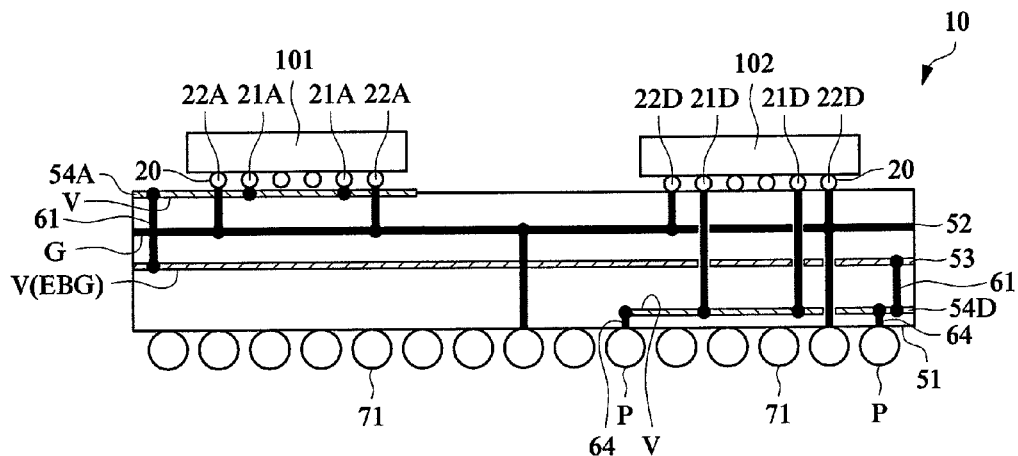
FIG. 12 is a structural diagram showing one example of routing of inner wire in a package board of a semiconductor device according to a second embodiment of the present invention.

FIG. 12 is a structural diagram showing one example of routing of inner wire in a package board of a semiconductor device according to a second embodiment of the present invention.

In a SIP (semiconductor device) 10 according to the second embodiment, the power layer for digital 54D is arranged on a side near a back face of the package board 51. That is, the power layer for digital 54D is disposed between the EBG layer 52 and the solder balls 71. Thereby, in a layer including a wiring layer of the power layer for digital 54D, wires for digital signal can be formed in a region corresponding to a portion just below the power layer for analog 54A, so that a wire use rate can be improved.

Note that, since the power layer for digital 54D is arranged on a side near the back face of the package board 51, the power layer for digital 54D can be connected to the solder balls 71 with a shortest route by shortening the digital power source connection viaholes 64. Thereby, connection to a printed board 80 (see FIG. 22) can be performed with low impedance and digital noise can be reduced.

And, in a layer including the wiring layer of the power layer for analog 54A, wires for analog signals can be formed in a region corresponding to a portion just above the power layer for digital 54D and a wire use rate can be improved like the above.

Note that, since the power layer for digital 54D is connected to the solder balls 71 with low impedance, the cut-off effect of the EBG layer is not affected. Accordingly, the SIP 10 according to the second embodiment can also obtain the effect similar to that in the SIP 10 according to the first embodiment.

Third Embodiment

Figure 13:
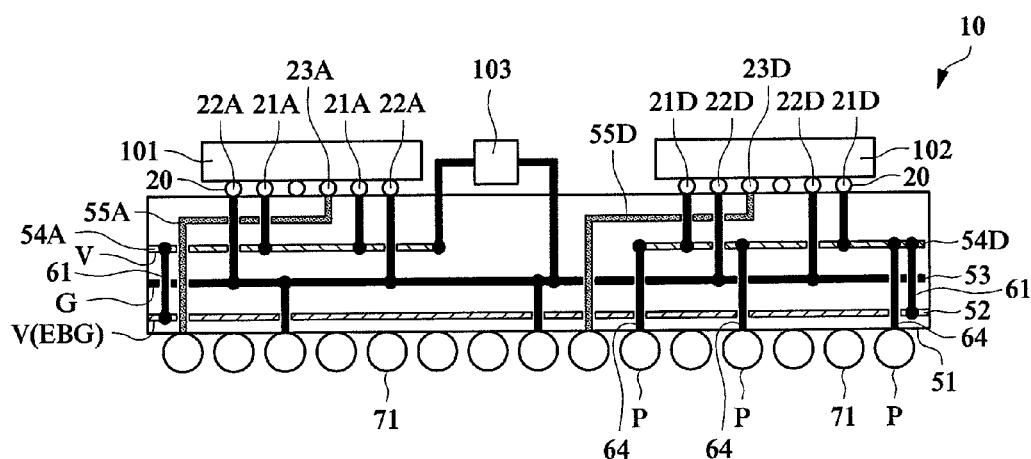
FIG. 13 is a structural diagram showing one example of routing of inner wire in a package board of a semiconductor device according to a third embodiment of the present invention.

FIG. 13 is a structural diagram showing one example of routing of inner wire in a package board of a semiconductor device according to a third embodiment of the present invention.

FIG. 13 is a diagram showing respective signal wires of the analog chip 101 and the digital chip 102 in the SIP (semiconductor device) 10 according to the third embodiment. Signal area for analog (signal area for analog element) 55A is wired adjacent to the power layer for analog 54A or the ground layer 53 to connect the analog chip 101 and the solder balls 71 to each other. For example, the signal area for analog 55A is disposed between the analog chip 101 and the power layer for analog 54A along the power layer for analog 54A and connects signal connection terminals for analog 23A that are signal connection terminals for the analog chip 101 and the solder balls 71 for analog signal.

By disposing the signal area for analog 55A adjacent to the power layer for analog 54A or the ground layer 53 in this manner, a return current of an analog signal can be caused to flow in the power layer for analog 54A or the ground layer 53. That is, if the signal area for analog 55A is positioned adjacent to the EBG layer 52, a return current of an analog signal flows in the EBG layer, so that a signal can not be propagated at a specific frequency. In order to avoid such an event, the signal area for analog 55A is positioned adjacent to the power layer for analog 54A or the ground layer 53 without positioning adjacent to the EBG layer 52.

Similarly, A signal area for digital (a signal area for a digital element) 55D is disposed between the digital chip 102 and the power layer for digital 54D along the power layer for digital 54D and connects signal connection terminals for digital 23D that are signal connection terminals for the digital chip 102 and the solder balls 71 for digital signal. Like the case of the analog signal, a return current of a digital signal can be caused to flow in the power layer for digital 54D or the ground layer 53, not in the EBG layer.

Note that, a modification of the SIP 10 shown in FIG. 13 that a solder ball positioned adjacent to a solder ball connected with the signal area for analog 55A is connected with the EBG layer 52 through viaholes and the former solder ball is utilized as a power connection terminal paired with a connection terminal for an analog signal can be adopted. According to the modification, a return route close to the signal route can be formed to a circuit device connected to the outside of the SIP, so that addition of noise can be further reduced.

Fourth Embodiment

Figure 14:
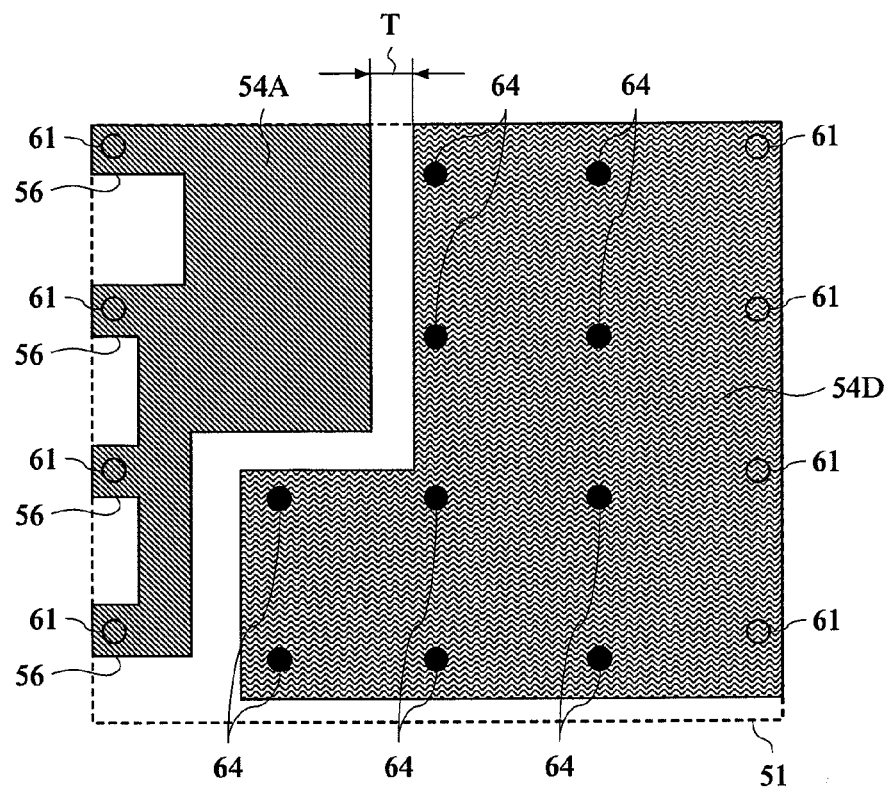
FIG. 14 is a plan diagram showing one example of a structure of a power layer for an analog element and a power layer for a digital element provided over a package board of a semiconductor device according to a fourth embodiment of the present invention.
Figure 15:
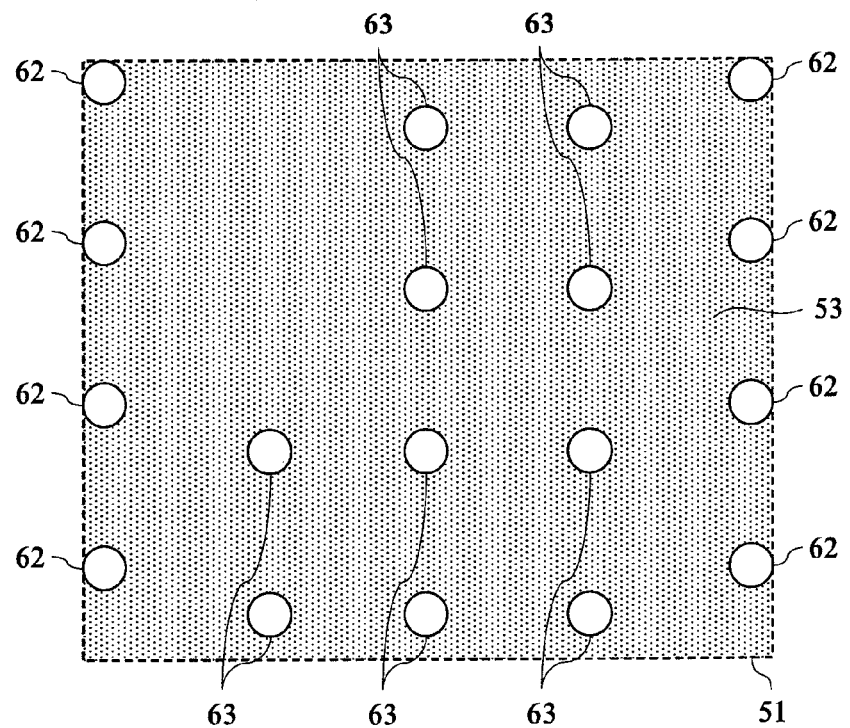
FIG. 15 is a plan diagram showing one example of a structure of a ground layer provided over the package board of the semiconductor device according to the fourth embodiment of the present invention.
Figure 16:
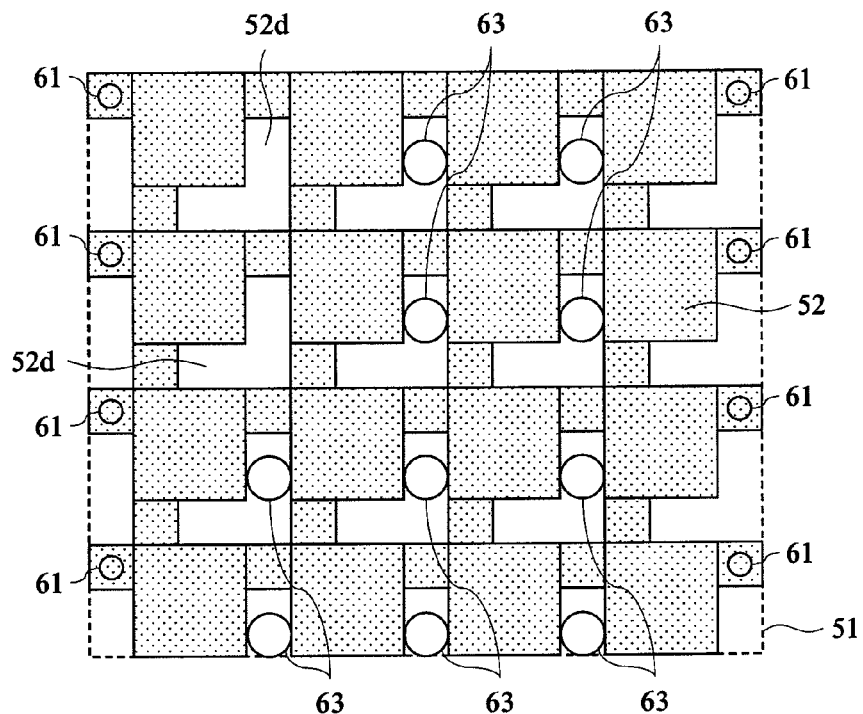
FIG. 16 is a plan diagram showing one example of a structure of an EBG layer provided over the package board of the semiconductor device according to the fourth embodiment of the present invention.

FIG. 14 is a plan diagram showing one example of a structure of a power layer for an analog element and a power layer for a digital element provided over a package board of a semiconductor device according to a fourth embodiment of the present invention, and FIG. 15 is a plan diagram showing one example of a structure of a ground layer provided over the package board of the semiconductor device according to the fourth embodiment of the present invention. FIG. 16 is a plan diagram showing one example of a structure of an EBG layer provided over the package board of the semiconductor device according to the fourth embodiment of the present invention, and FIG. 17 is a back view showing one example of an arrangement state of external terminals of the semiconductor device according to the fourth embodiment of the present invention.

The semiconductor device according to the fourth embodiment has a structure in which the EBG layer 52 is modified. FIG. 14 shows a power layer (V), and shows a structure in which area of the power layer for analog 54A is smaller than that of the first embodiment, on the other hand, area of the power layer for digital 54D is larger than that of the first embodiment. Even if the area of the power layer for analog 54A is made smaller in this manner, the power layer for analog 54A and the EBG connection viaholes 61 can be reliably connected to each other by connection to the EBG connection viaholes 61 via leading wires 56 in the power layer for analog 54A.

That is, in the power layer for analog 54A with reduced area, by forming narrow leading wires 56 and connecting the EBG connection viaholes 61 to the leading wires 56, the power layer for analog 54A and the EBG layer 52 are securely connected to each other via the leading wires 56 and the EBG connection viaholes 61. Note that, the leading wire 56 is, for example, a leading wire having a width approximately equal to that of the second wiring pattern 52b having small area of the unit cell 52c of the EBG layer 52.

Figure 17:
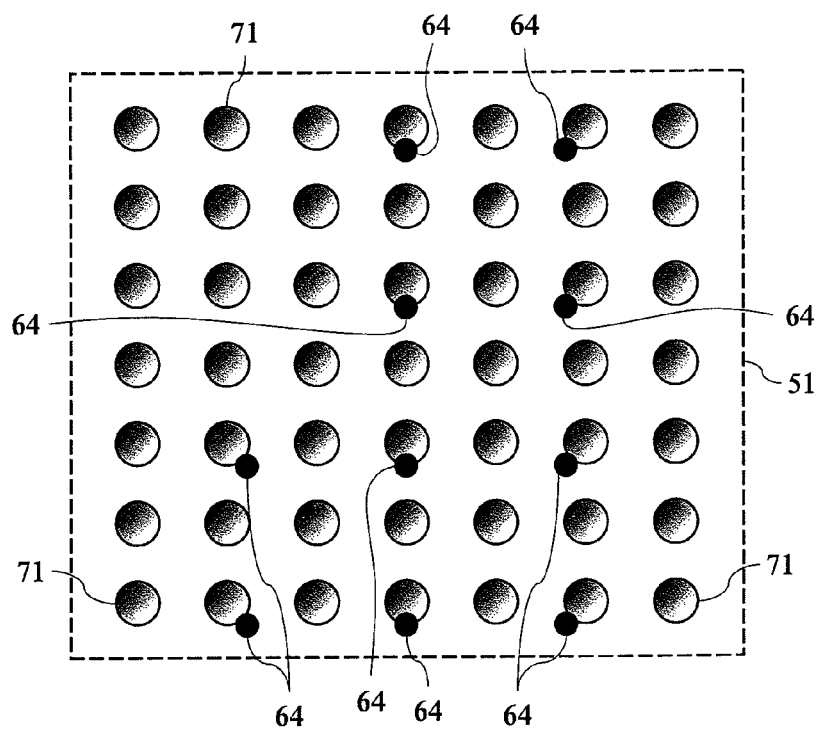
FIG. 17 is a back diagram showing one example of an arrangement state of external terminal of the semiconductor device according to the fourth embodiment of the present invention.

On the other hand, since the area of the power layer for digital 54D is larger than that in the first embodiment, more digital power connection viaholes 64 are connected to the power layer for digital 54D, and the power connection viaholes 64 are directly connected to solder balls 71 that are external terminals shown in FIG. 17 through power connection viahole anti-pads 63 of the ground layer 53 shown in the ground layer (G) of FIG. 15 and power connection viahole anti-pads 63 of the EBG layer 52 shown in the EBG layer (V(EBG)) of FIG. 16.

As mentioned above, since the power layer for digital 54D and the solder balls 71 are connected through more digital power connection viaholes 64 on digital side, noise generated from the digital chip 102 can be reduced.

Thereby, power source noise can be cut off by the EBG layer 52 even in the digital chip 102 with large power consumption and high clock frequency.

As a result, a power supplying impedance of a digital circuit in the digital chip 102 is reduced so that the quality of signals in the SIP (semiconductor device) 10 can be further improved.

Note that, as shown in FIG. 14, it is necessary to provide an interval of T or more between the power layer for digital 54D and the power layer for analog 54A. For example, T is 1 mm. Thereby, direct interference of digital power source noise from the power layer for digital 54D to the power layer for analog 54A can be prevented.

Fifth Embodiment

Figure 18:
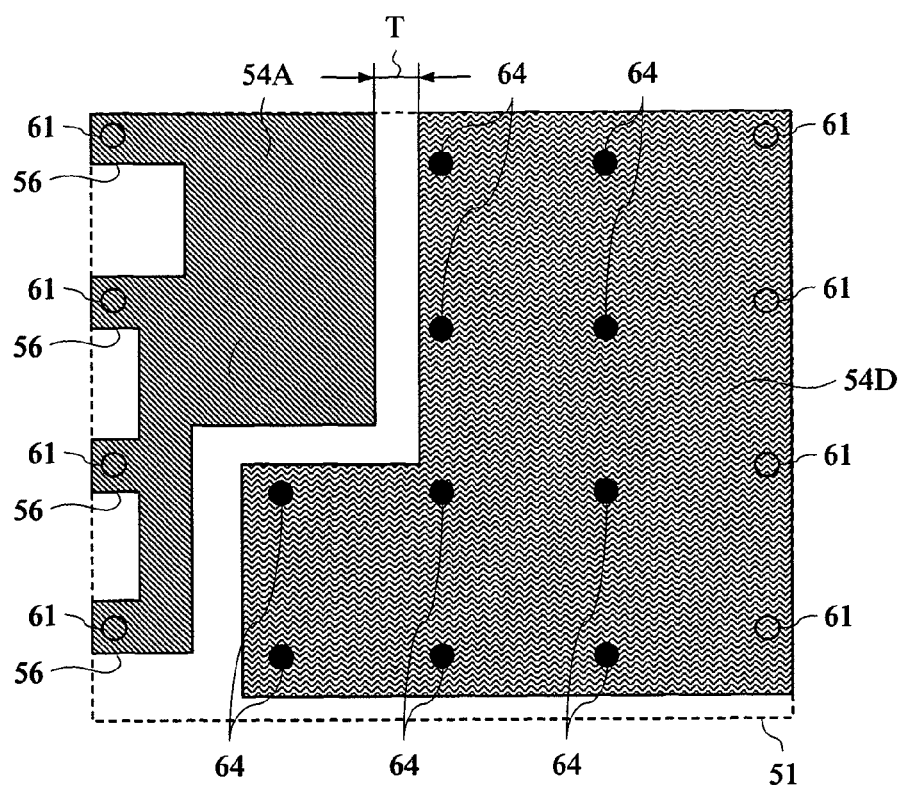
FIG. 18 is a plan diagram showing one example of a structure of a power layer for an analog element and a power layer for a digital element provided over a package board of a semiconductor device according to a fifth embodiment of the present invention.
Figure 19:
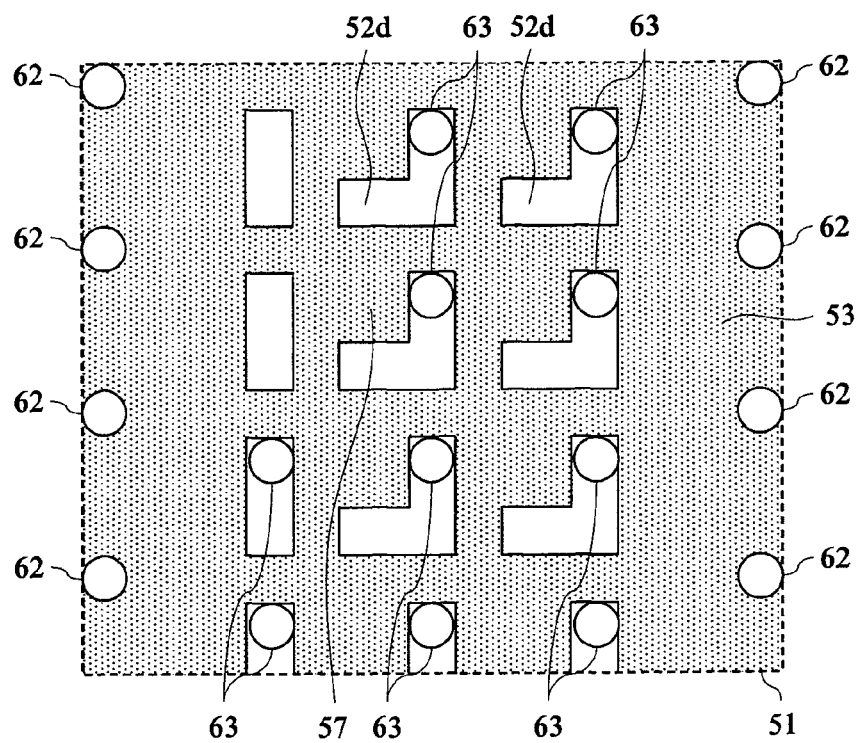
FIG. 19 is a plan diagram showing one example of a structure of a first EBG layer provided over a ground layer of the package board of the semiconductor device according to the fifth embodiment of the present invention.
Figure 20:
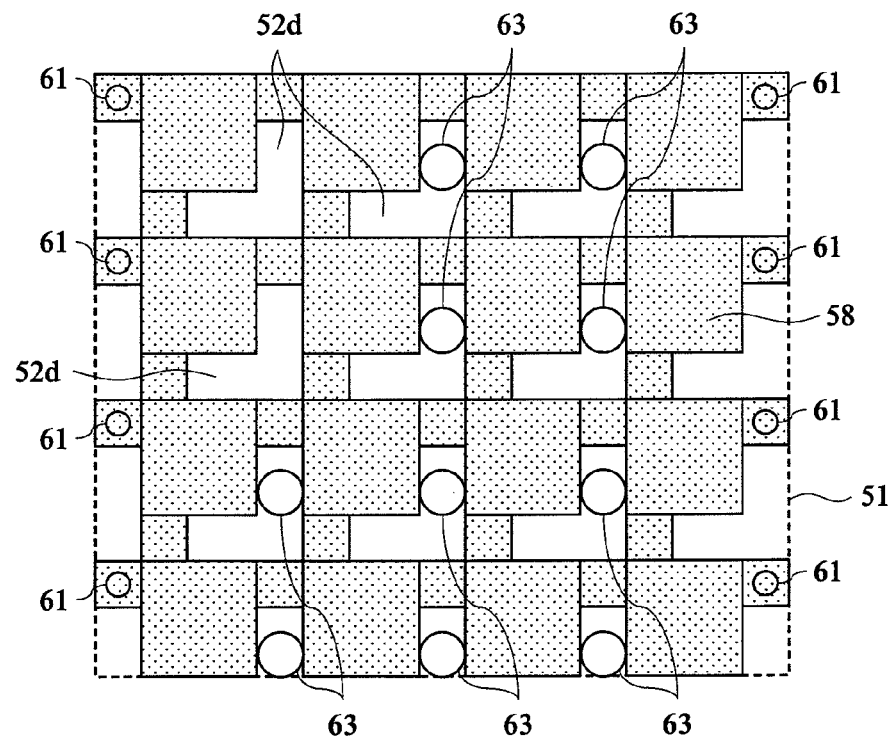
FIG. 20 is a plan diagram showing one example of a structure of a second EBG layer provided over the ground layer of the package board of the semiconductor device according to the fifth embodiment of the present invention.
Figure 21:
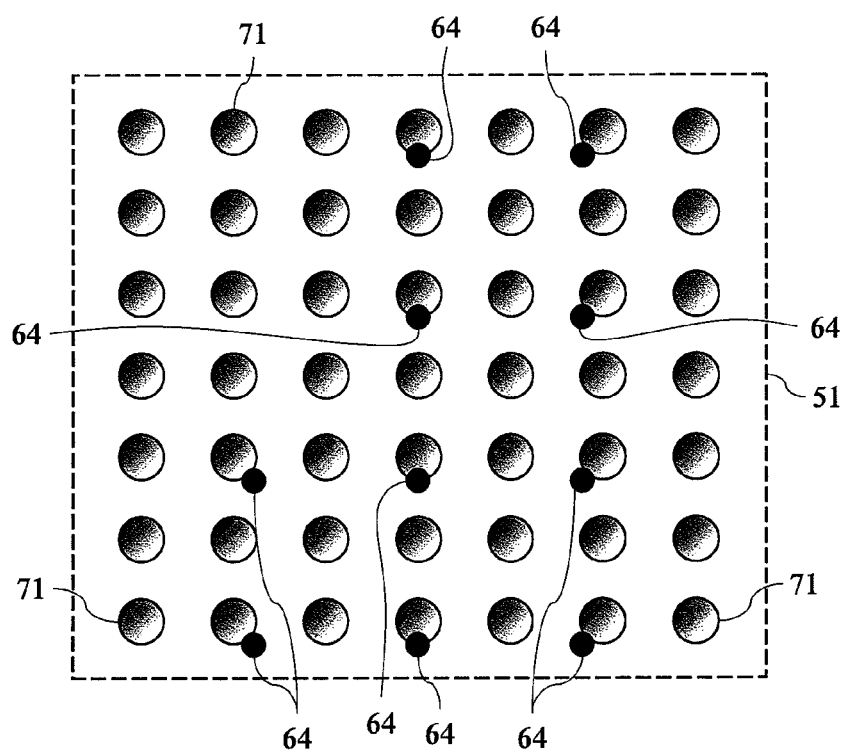
FIG. 21 is a back diagram showing one example of an arrangement state of external terminal of the semiconductor device according to the fifth embodiment of the present invention.

FIG. 18 is a plan diagram showing one example of a structure of a power layer for an analog element and a power layer for a digital element provided on a package board of a semiconductor device according to a fifth embodiment of the present invention, and FIG. 19 is a plan diagram showing one example of a structure of a first EBG layer provided on a ground layer of the package board of the semiconductor device according to the fifth embodiment of the present invention. Furthermore, FIG. 20 is a plan diagram showing one example of a structure of a second EBG layer provided over the package board of the semiconductor device according to the fifth embodiment of the present invention, and FIG. 21 is a back diagram showing one example of an arrangement state of external terminals of the semiconductor device according to the fifth embodiment of the present invention.

The semiconductor device according to the fifth embodiment shown in FIG. 18 to FIG. 21 has a structure of another modification of the EBG layer 52. Two EBG patterns for ground and for digital are provided with respect to a power layer (V) shown in FIG. 18. That is, in addition to the EBG layer for power source (second EBG layer) 58 of the EBG layer (V(EBG)) shown in FIG. 20, a EBG layer for ground (a first EBG layer) 57 is also formed on the ground layer 53 that is a ground layer (G) shown in FIG. 19.

As mentioned above, by forming the EBG layer for ground 57 on the ground layer 53, the EBG layer for ground 57 is paired with the EBG layer for power source 58 of the EBG layer so that a noise cut-off effect can be further increased.

Sixth Embodiment

Figure 22:
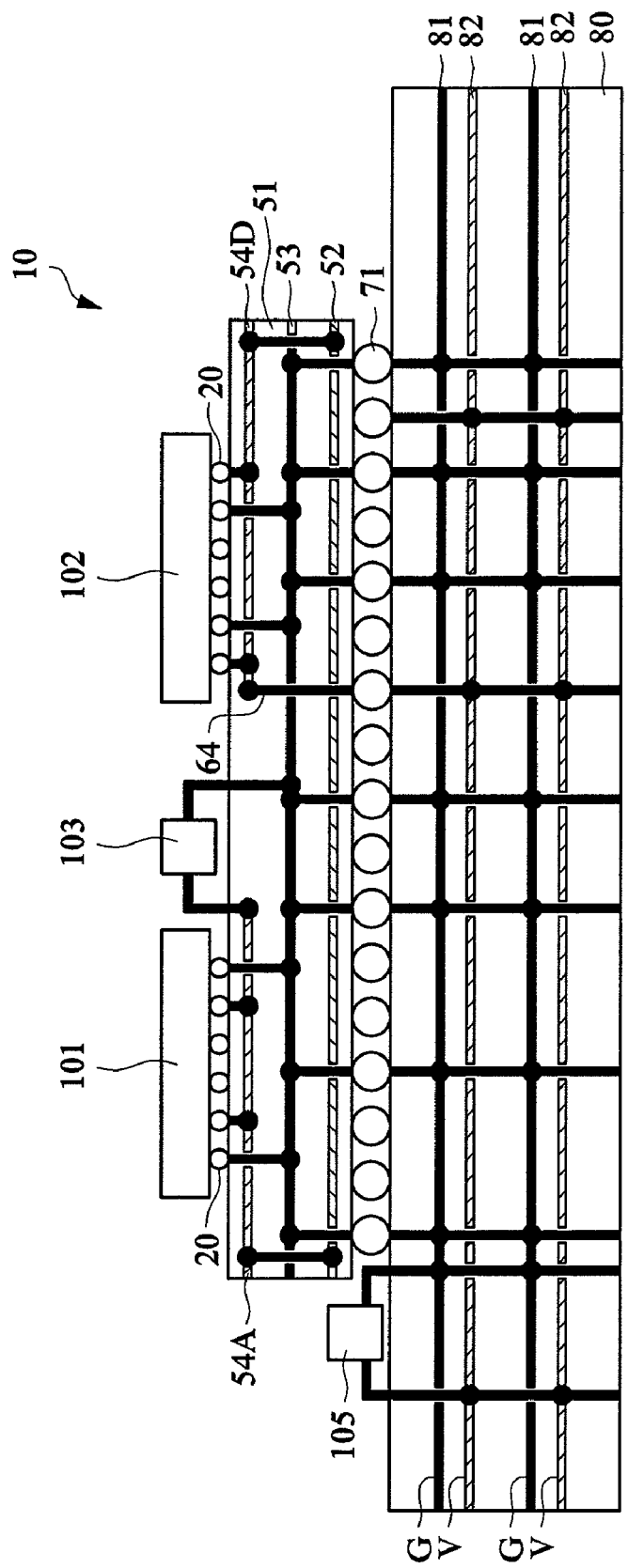
FIG. 22 is a structural diagram of one example of routing of inner wire in a mounting state of a semiconductor device according to a sixth embodiment of the present invention.

FIG. 22 is a structural diagram showing one example of routing of inner wire in a mounted state of a semiconductor device according to a sixth embodiment of the present invention.

In the sixth embodiment, connection of wires at mounting of an SIP 10 to the printed board 80 is explained. The ground layer 53 of the SIP 10 is connected to a ground layer 81 of the printed board 80, and the power layer for digital 54D is connected to a power layer 82 of the printed board 80. Note that, the power layer for analog 54A is not directly connected to solder balls 71 but connected via the EBG layer 52 certainly.

In a structure in which the power layer for analog 54A is connected to the solder balls 71 without interposition of the EBG layer 52, power source noise induced between the power layer for digital 54D and the ground layer 53 is propagated between the power layer 82 and the ground layer 81 of the printed board 80 and propagated from the power layer 82 to the power layer for analog 54A. That is, noise reduction effect obtained by the EBG layer 52 in the SIP 10 is reduced. In order to avoid such an event, the power layer for analog 54A is connected to the solder balls 71 via the EBG layer 52 certainly.

Note that, since an onboard decoupling capacitance 105 is mounted on the printed board 80, noise in the printed board 80 is reduced by the onboard decoupling capacitance 105.

Seventh Embodiment

FIG. 23 is a block diagram showing one example of use of a semiconductor device according to a seventh embodiment of the present invention, showing a structure of an example in which the SIP 10 is incorporated into a digital camera 90.

In the SIP 10 including the EBG pattern incorporated into the digital camera 90, image information (data) taken by an imaging device 91 through a lens 90 is processed at the digital chip 102 that is a digital processing unit in the SIP 10 and is displayed on a display unit 93. On the other hand, analog processing for communication with a printer, a personal computer, or a web server in internet via an antenna 94 is processed at the analog chip 101 that is an RF unit. When both the processings are performed, power source noise mainly generated from the digital chip 102 is cut off by a noise cut-off means 95. In the first to seventh embodiments, the noise cut-off means 95 is the EBG layer 52 (including the EBG layer for ground 57 and the EBG layer for power source 58) formed over the package board 51.

Eighth Embodiment

Figure 24:
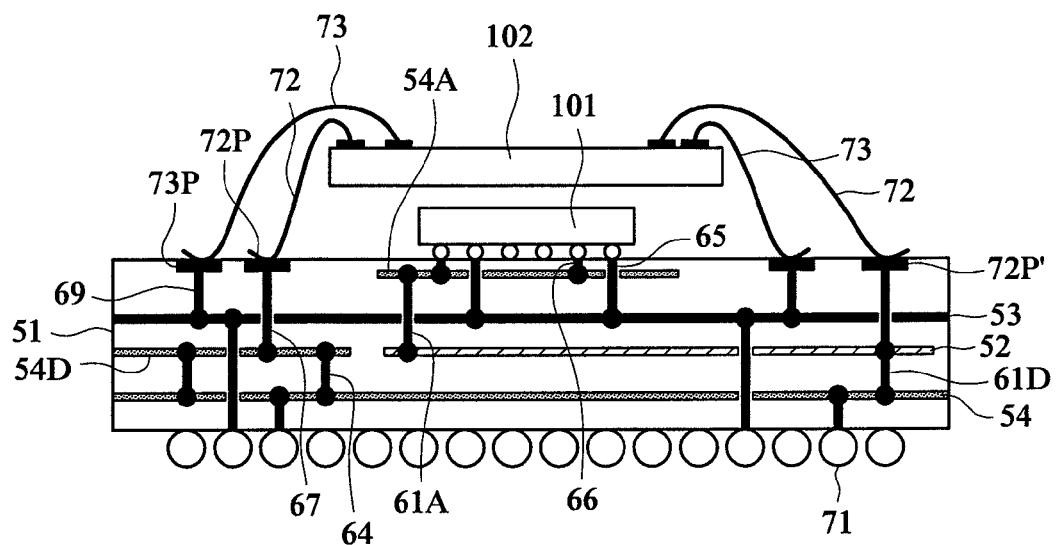
FIG. 24 is a cross-sectional diagram of routing of inner wire in a package board of a semiconductor device according to an eighth embodiment of the present invention.

FIG. 24 is a cross-sectional diagram of a semiconductor device according to an eighth embodiment of the present invention. The semiconductor device according to the present embodiment has a structure in which the analog chip 101 and the digital chip 102 are stacked. The analog chip 101 is connected to a package board 51 in a flip-chip manner with a main face thereof directed to the package board 51. The digital chip 102 is stacked over the analog chip 101 with a main face thereof directed outward.

In the package board 51, a power layer 54, an EBG layer 52, and a ground layer 53 are disposed from a layer near a face on which solder balls 71 are arranged in a two-dimensional array in this order. Furthermore, at a central region of a layer positioned above the ground layer 53, a power layer for analog 54A is provided. A ground connection terminal of the analog chip 101 is connected to the ground layer 53 via a viahole 65. A power connection terminal of the analog chip 101 is connected to the power layer for analog 54A via a viahole 66. The power layer 54 and solder balls 71 for external connection are connected in a viahole connection. The power layer 54 and the EBG layer 52 are connected through viaholes 61D. The EBG layer 52 and the power layer for analog 54A are connected through viaholes 61A positioned at an opposite side to the position of the viaholes 61D of the EBG layer 52. On the other hand, in a region of an end of a layer positioned at the same depth as that of the EBG layer 52 of the package board 51, a power layer for digital 54D is provided. The power layer for digital 54D is connected to the power area 54 through viaholes 64, and the power layer for digital 54D is connected to the power connection pad 72P through a viahole 67. The ground layer 53 is connected to a ground connection pad 73P through a viahole 69. Another power connection pad 72P' is connected to a viahole 61D directly connected to the power layer 54. The power connection pads 72P, 72P' and the ground connection pad 73P are connected to the digital chip 101 through bonding wires 72 and 73 respectively. Though not illustrated, other wires for signals and the like other than the power wires and ground wires described above exist. The analog chip and the digital chips are encapsulated by encapsulating resin (not shown) to be integrated with the package board 51.

In the semiconductor device according to the present embodiment, power supplying to the power layer for analog 54A is performed via the EBG layer 52. And, the ground layer 53 exists between the power layer for analog 54A and the EBG layer 52. The two configurations are similar to those of the first embodiment explained with reference to FIG. 3 and the like, and an effect similar to that in the semiconductor device according to the first embodiment can be obtained with cut-off of noise between the digital chip and the analog chip.

Ninth Embodiment

Figure 25:
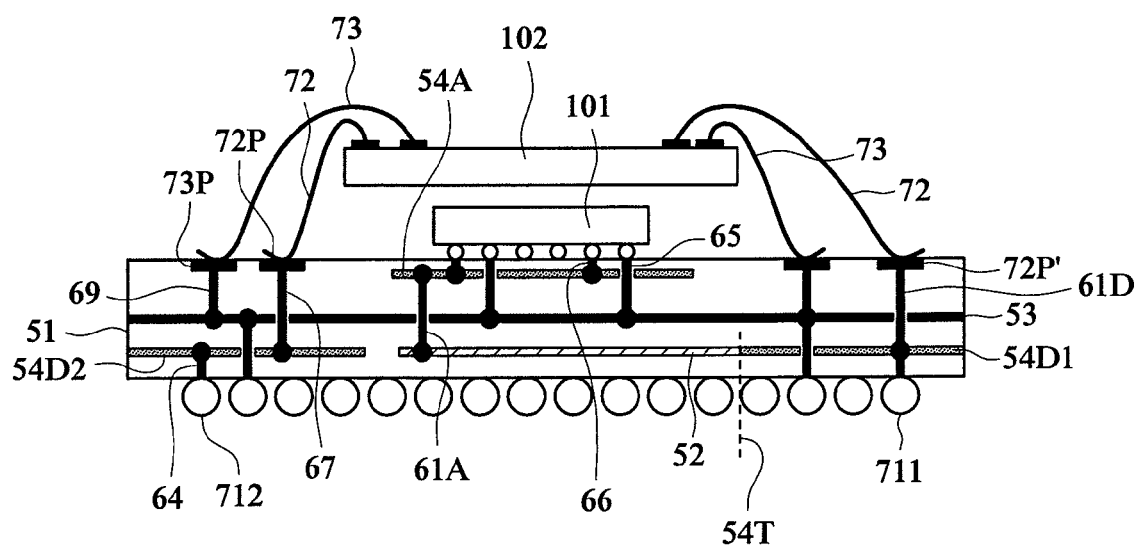
FIG. 25 is a cross-sectional diagram of routing of inner wire in a package board of a semiconductor device according to a ninth embodiment of the present invention.

FIG. 25 is a cross-sectional diagram of a semiconductor device according to a ninth embodiment of the present invention. In the semiconductor device, a structure of a portion positioned above a ground layer 53 of a package board 51 to the digital chip 102 is completely equal to that of the semiconductor device according to the eighth embodiment.

Figure 26A:
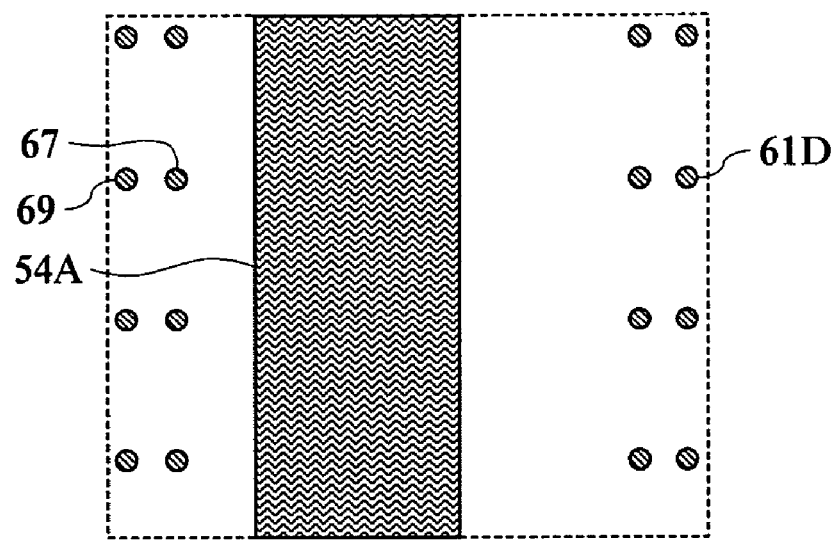
FIG. 26A is a plan diagram showing a structure of a power layer for an analog element over a package board of the semiconductor device according to the ninth embodiment.
Figure 26B:
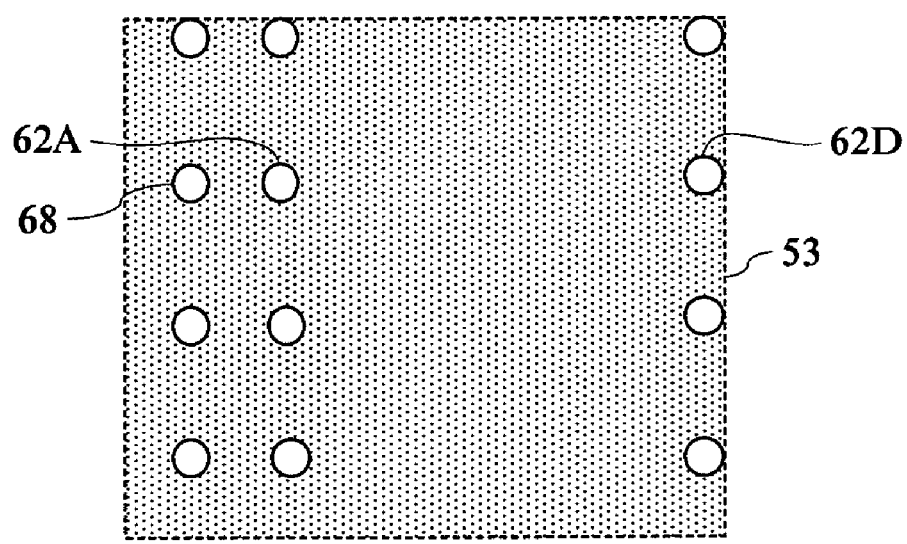
FIG. 26B is a plan diagram showing a structure of a ground layer over the package board of the semiconductor device according to the ninth embodiment.

FIG. 26A is a plan diagram of a layer in which the power layer for analog 54A exists of the package board 51 of the semiconductor device according to the ninth embodiment. FIG. 26B is a plan diagram of a layer in which the ground layer 53 exists. FIG. 26D is a plan diagram of back face of the package board. These plan diagrams are common to the semiconductor device according to the eighth embodiment.

Figure 26C:
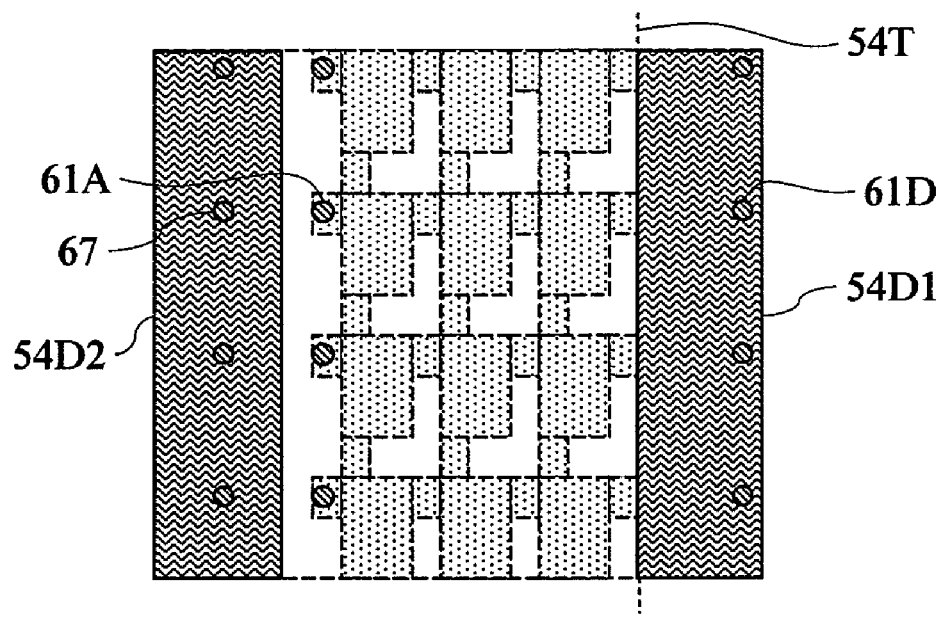
FIG. 26C is a plan diagram showing a structure of an EBG layer and a power layer for a digital element over the package board of the semiconductor device according to the ninth embodiment.
Figure 26D:
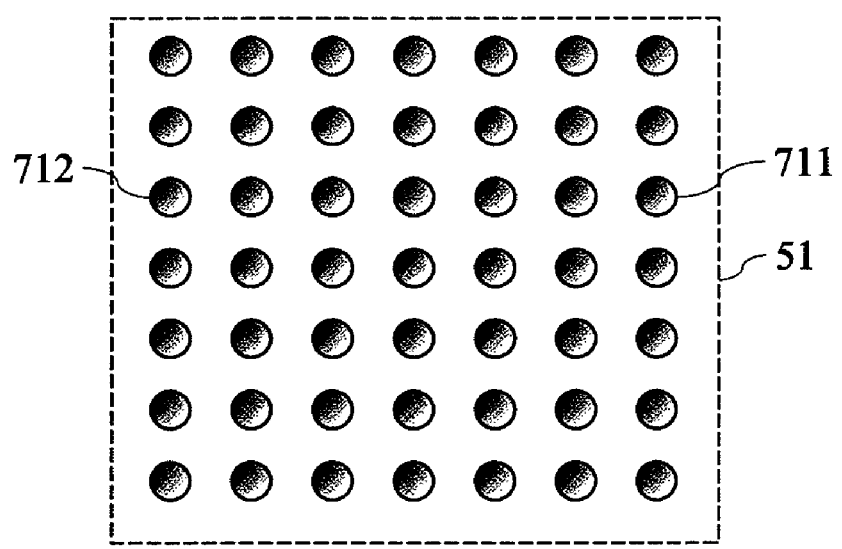
FIG. 26D is a plan diagram of a back face of the package board of the semiconductor device according to the ninth embodiment.

FIG. 26C is a plan diagram of a face in which the EBG layer 52 exists of the package board 51 of the semiconductor device according to the ninth embodiment. As shown in FIG. 26C and FIG. 25, the EBG layer 52 is formed on only a middle region of the package board 51, and power areas for digital chip 54D1 and 54D2 made from an even metal layer are formed in regions near both left and right ends. The power area for digital chip 54D1 contacts with the EBG layer 52. In other words, a pattern changes from the even metal layer to a metal layer of the EBG pattern at a boundary position 54T between the power area for digital chip 54D1 and the EBG layer 52. The power area for digital 54D2 separated from the EBG layer 52 are connected to solder balls 712 for power supplying from the outside through viaholes 64, and is also connected to the pads 72P connecting power source to the digital chip 101 through viaholes 67. The power area for digital 54D1 is connected to other pads 72P' for connecting a power source to the digital chip 101 and other solder balls 711 for power supplying from the outside through viaholes 61D. Furthermore, the EBG layer 52 is connected to the power layer for analog 54A through the viaholes 61A positioned near an end portion opposed to a side contacting with the power area for digital 54D1. In FIG. 26B, anti-pads 68, 62A, and 62D provided on the ground layer 53 such that the viaholes 67, 61A, and 61D extend through the ground layer 53 without contacting therewith are shown. Thereby, a power supplying route to the analog chip 101 is formed.

Also in the present embodiment, the configuration in which the power layer for analog is arranged to be insulated by the ground layer and the EBG layer lies between the power supplying route to the digital chip and the power layer for analog is employed. And therefore, in terms of preventing the noise leakage between the digital chip and the analog chip via the power supplying route, an effect equivalent to that of the semiconductor device according to the eighth embodiment can be obtained.

Tenth Embodiment

Figure 27:
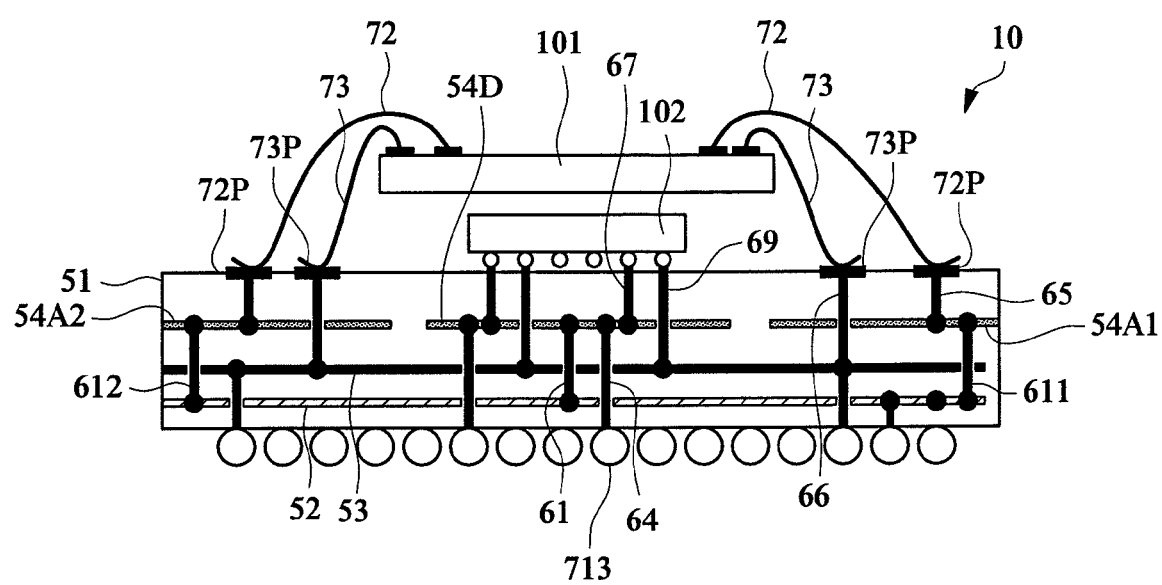
FIG. 27 is a cross-sectional diagram of routing of inner wire over a package board of a semiconductor device according to a tenth embodiment of the present invention.

FIG. 27 is a cross-sectional diagram of a semiconductor device according to a tenth embodiment. The semiconductor device according to the present embodiment has a configuration in which the stacking order of the analog chip 101 and the digital chip 102 is reversed to that in the eighth embodiment or the ninth embodiment. The digital chip 102 is connected to the package board 51 in a flip-chip manner with a main face thereof directed to the package board 51. The analog chip 101 is stacked over the digital chip 102 with a main face thereof directed outward.

Figure 28A:
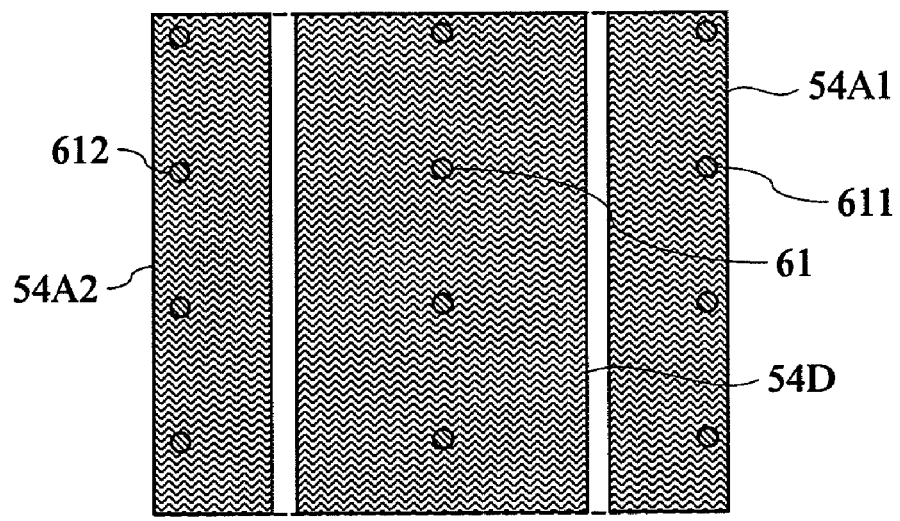
FIG. 28A is a plan diagram of an individual power layer of the package board of the semiconductor device according to the tenth embodiment.
Figure 28B:
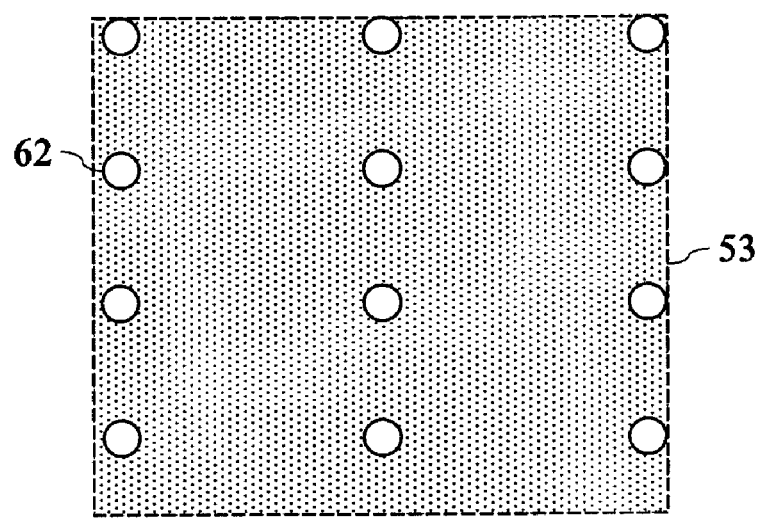
FIG. 28B is a plan diagram of a ground layer of the package board of the semiconductor device according to the tenth embodiment.
Figure 28C:
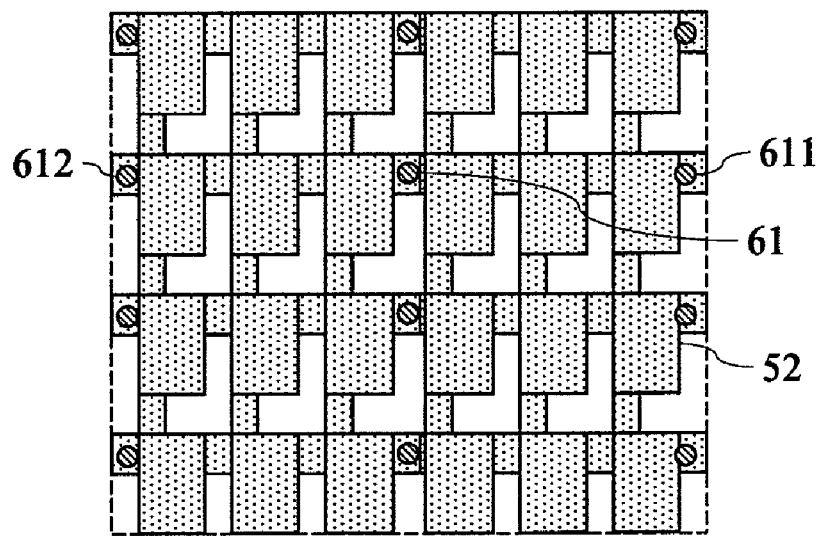
FIG. 28C is a plan diagram of an EBG layer in the package board of the semiconductor device according to the tenth embodiment.
Figure 28D:
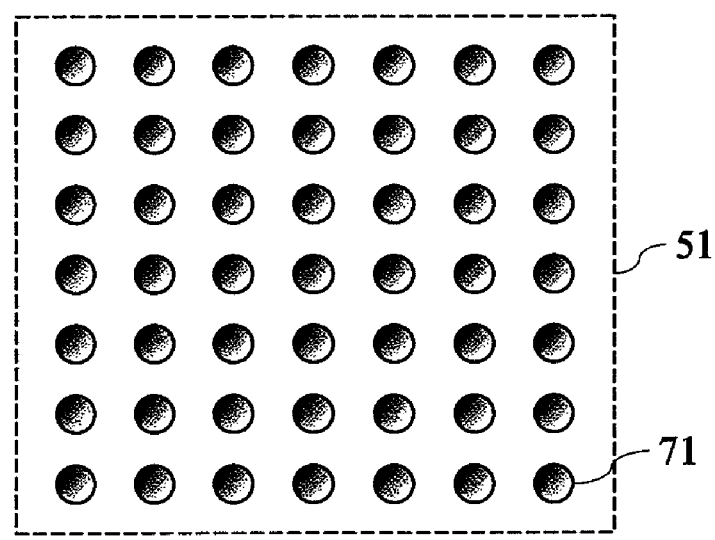
FIG. 28D is a plan diagram of a back face of the package board of the semiconductor device according to the tenth embodiment.

FIG. 28A is a plan diagram of an individual power source layer of the package board 51 according to the tenth embodiment, FIG. 28B is a plan diagram of a ground layer, FIG. 28C is a plan diagram of an EBG layer, and FIG. 28D is a plan diagram of back face of the package board.

As shown in FIGS. 28A, 28B, 28C, and 28D, a power area for analog 54A1, a power layer for digital 54D, and another power area for analog 54A2 are arrayed on the individual power layer of the package board 51 so as to be separated from one another. The power layer for digital 54D positioned at a central area is connected to solder balls 713 on back face of the board through viaholes 64, so that power is supplied externally. Power bumps of the digital chip 102 are connected to viaholes 67 connected to the power layer for digital 54D. Ground bumps of the digital chip 102 are connected to viaholes 69 connected to the ground layer 53 of the ground layer. To the power areas for analog 54A1 and 54A2, power is externally supplied indirectly via the power layer for digital 54D. That is, a central portion of the EBG layer 52 is connected to the power layer for digital 54D through viaholes 61, and both end portions of the EBG layer 52 are connected to the power areas for analog 54A1 and 54A2 through viaholes 611 and 612, respectively. As shown in FIG. 28B, on the ground layer 53 occupying almost all area of the board, anti-pads 62 through which the viaholes 61, 611, and 612 extend are provided. The power pads 72P are connected with power areas for analog 54A1 and 54A2 respectively, and the ground layer and ground pads 73P are connected through viaholes 66. By connecting the power pads 72P and the analog chip 101 by bonding wires 72 and connecting the ground pads 73P and the analog chip 101 using bonding wires 73, Power supplying route to the analog chip 101 is completed In the present embodiment, the EBG pattern having an effective length of about half of length of the package board lies in the power supplying route reaching the analog chip and the EBG layer is disposed at a position isolated by the ground layer. By this structure, noise leakage between the digital chip and the analog chip can be prevented effectively.

Eleventh Embodiment

Figure 29:
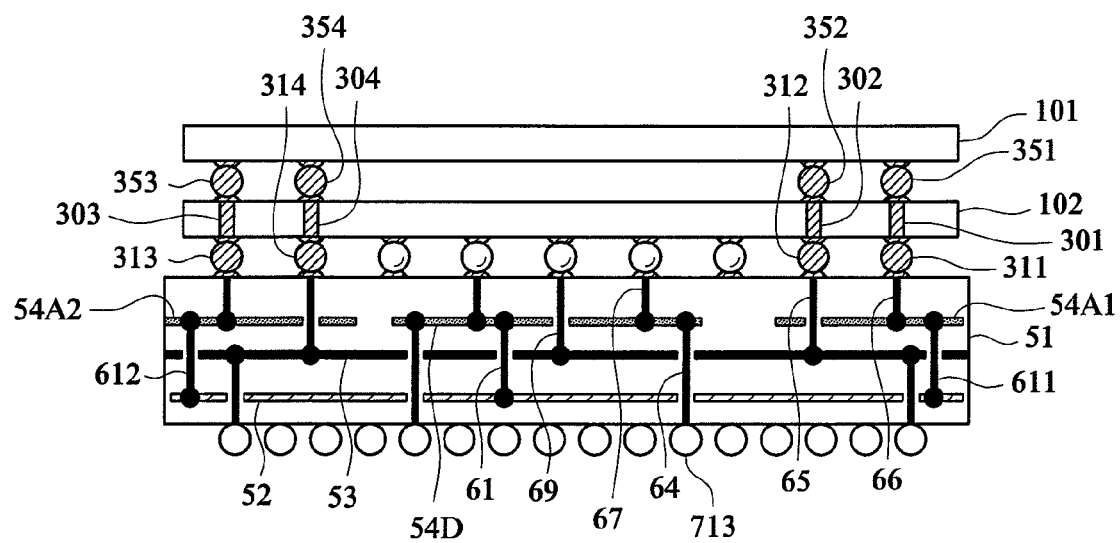
FIG. 29 is a cross-sectional diagram showing a structure of a semiconductor device according to an eleventh embodiment of the present invention.

FIG. 29 is a cross-sectional diagram of a semiconductor device according to an eleventh embodiment. The semiconductor device according to the present embodiment has a structure in which an analog chip is stacked in a flip-chip manner over a digital chip stacked over a board in a flip-chip manner. Structures of respective layers in a package board 51 are the same as those in the package board in the tenth embodiment. Since the same parts or portions are attached with the same reference symbols, explanation of FIGS. 27 and 28A to 28D can be referred to.

Solder balls are arranged on a bottom face of the digital chip 102 and are connected with pressure bonding to pads arranged on a top face of the package board. Some of solder balls of the solder balls positioned in a middle region are connection bumps for power feeding to a circuit inside the digital chip 102, and are connected to pads at distal ends of viaholes 67 connected to the power layer for digital 54D of the package board 51 or pads at distal ends of viaholes 69 connected to the ground layer 53.

On the other hand, a plurality of through viaholes are formed on a peripheral area of the digital chip 102 and electric connections between the analog chip 101 and the package board 51 are performed via these through viaholes. Since solder balls 311 are connected to distal ends of viaholes 66 extending from the power area for analog 54A1, through viaholes 301 is connected to a power source VCC. Similarly, since solder balls 313 are connected to distal ends of viaholes extending from the power area for analog 54A2, through viaholes 303 are also connected to the power source VCC. On the other hand, since solder balls 312 are connected to distal ends of viaholes 65 extending from the ground layer 54, through viaholes 302 are connected to a ground VSS. Since solder balls 314 are connected to other viaholes extending from the ground layer 54, through viaholes 304 are also connected to the ground VSS. Pads at the other ends of the through viaholes 301 to 304 and pads of the analog chip 101 are connected through solder balls 351 to 354 respectively, so that power supplying route to the analog chip 101 is formed. Note that, wires except for wires for power supplying are omitted also in FIG. 29. In an actual semiconductor device, wires for signal transmission exist. In a preferable example, for transmission of a signal between the digital chip and the package board, the signal route utilizing through viaholes formed on the analog chip is used.

In the present embodiment, noise leakage between the digital chip and the analog chip can be prevented effectively like the tenth embodiment.

Twelfth Embodiment

Figure 30:
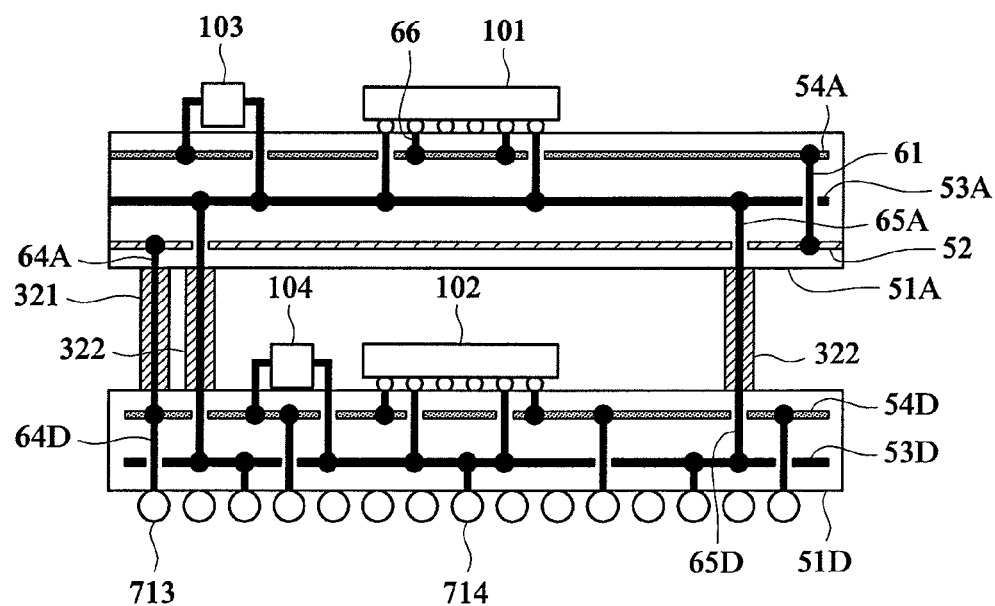
FIG. 30 is a cross-sectional diagram showing a structure of a semiconductor device according to a twelfth embodiment of the present invention.
Figure 31:
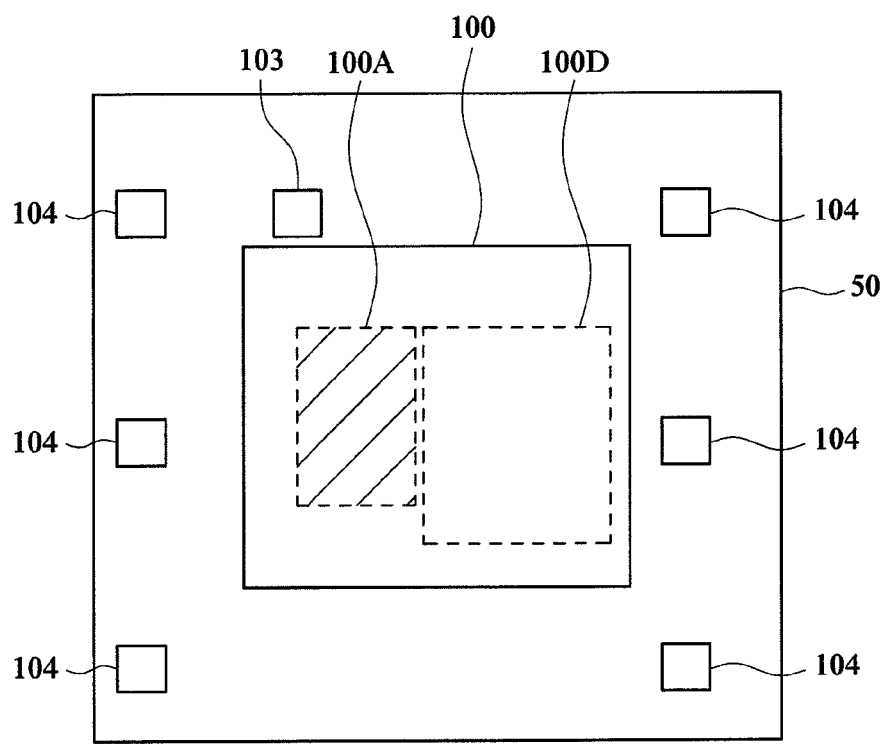
FIG. 31 is a cross-sectional diagram showing a structure of a semiconductor device according to a thirteenth embodiment of the present invention.
Figure 32:
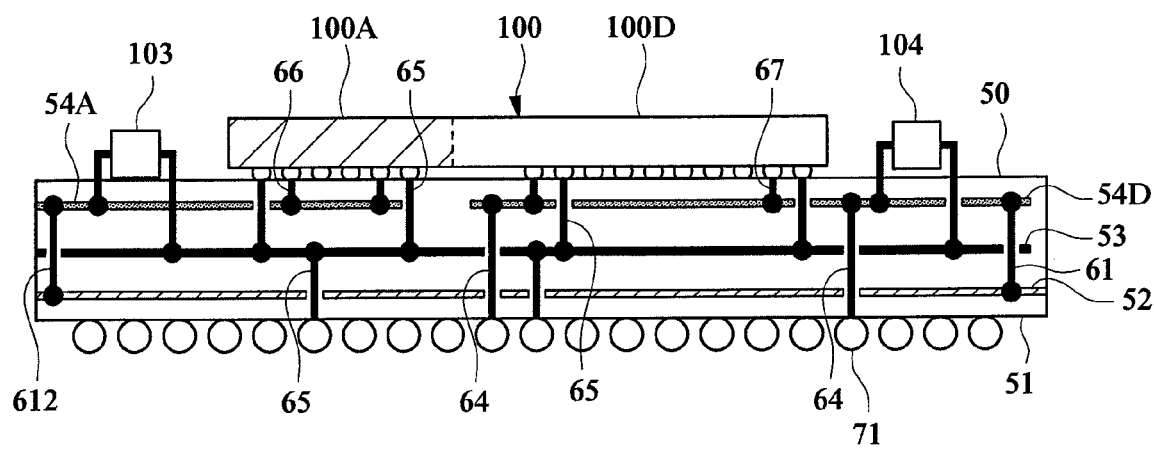
FIG. 32 is a cross-sectional diagram showing a structure of a semiconductor device according to the thirteenth embodiment of the present invention.

FIG. 30 is a cross-sectional diagram of a semiconductor device according to a twelfth embodiment. The semiconductor device according to the present embodiment has a board over which an analog chip is mounted and a board over which a digital chip is mounted and has a composite package structure as a whole.

A board 51D including a solder ball array for external connection includes a ground layer 53D and a power source layer 54D. The power source layer 54D is connected to solder balls 713 through viaholes 64D, so that a power source voltage VCDD for a digital chip is applied externally. The ground layer 53D is connected to solder balls 714 so that a ground voltage VSSD is applied. The digital chip 102 is connected to the board 51D in a flip-chip manner to be connected to the power source layer 54D and the ground layer 53D, so as to receive power supply. A decoupling capacitor 104 for stabilizing power to be supplied is connected between the power source layer 54D and the ground layer 53D.

The board 51A includes an EBG layer 52, a ground layer 53A, and a power layer for analog 54A in this order from below. The respective layers are formed so as to extend approximately from one end to the other end of the board 51A. The board 51A is fixed to the board 51D by metal pins 321, 322, and 323. The metal pins also constitute a part of a route for supplying power to the analog chip 101. That is, one end portion of the EBG layer 52 of the board 51A is connected to the power layer for digital 54D of the board 51D via the viahole 64A, the metal pin 321, and the viahole 64D. Furthermore, the other end portion of the EBG layer 52 is connected to the power layer for analog 54A through the viahole 61. A ground layer 53A of the board 51A is connected to the ground layer 53D of the board 51D via viaholes 65A, metal pins 322, and viaholes 65D. The analog chip 101 is connected to the board 51A in a flip-chip manner to be connected to the power layer for analog 54A and the ground layer 53A, so as to receive power supply. A decoupling capacitor 103 for power source stabilization is connected between the power layer for analog 54A and the ground layer 53A.

In the power supplying route to the analog chip 101 described above, since the EBG layer 52 lies, cut-off of noise between the analog chip and the digital chip can be achieved like the other embodiments.

Thirteenth Embodiment

FIG. 33 is a plan diagram of a semiconductor device according to a thirteenth embodiment, and FIG. 34 is cross-sectional diagram of the semiconductor device. In the semiconductor device according to the present embodiment, a semiconductor chip on which both an analog integrated circuit and a digital integrated circuit are formed is used.

The analog integrated circuit is formed on a region 100A which is a part of a semiconductor chip 100. The analog integrated circuit is hereinafter called "analog section". And, a digital integrated circuit is formed on other portion 100D adjacent to the analog section. The digital integrated circuit is hereinafter called "digital section 100D". The analog section 100A and the digital section 100D are provided with individual power bumps and ground bumps, respectively, so that they are supplied with power individually.

The structure of the package board 51 is basically equal to that of the package board of the first embodiment explained with reference to FIG. 3. That is, the package board 54 includes an EBG layer 52 and a ground layer 53 in this order from below. A region which is a part of a layer above the ground layer 53 is the power area layer for analog 54A and the other region is the power layer for digital 54D. One end of the EBG layer 52 and the power layer for analog 54A are connected via viaholes 612. The other end of the EBG layer 52 and the power layer for digital 54D are connected via viaholes 61. Power bumps of the digital section 100D of the semiconductor chip 100 are connected to the power layer for digital 54D via viaholes 67, and ground bumps are connected to the ground layer 53 via viaholes 65. Power bumps of the analog section 100A of the semiconductor chip 100 are connected to the power layer for analog 54A via viaholes 66. Solder balls 71 for power supplying and the power layer for digital 54D are connected via viaholes 64, and solder balls for grounding and the ground layer 53 are connected.

As described above, the EBG layer lies in the power supplying route reaching the analog section 10A, and therefore, even if the digital section 100A and the analog section 100B are connected in a DC manner, they are cut off at a specific high frequency range. Thereby, effect of cut-off of noise between the analog section and the digital section can be achieved.

Although the present invention made by the present inventors has been specifically described with reference to the embodiments, the present invention is not limited to the above embodiments, and may be variously modified without departing from the spirit thereof.

For example, in the first to seventh embodiments, a case of the semiconductor device of BGA type has been explained, but the external terminals of the semiconductor device are not limited to the solder balls 71 and they may be lands or the like. Accordingly, the semiconductor device may be an LGA (Land Grid Array) or the like.

The present invention can be suitably applied to an electronic device including an analog semiconductor element and a digital semiconductor element.

What is claimed is:

1. A semiconductor device comprising:
   a digital semiconductor element connected with a power connection terminal and a ground connection terminal;
   an analog semiconductor element connected with a power connection terminal and a ground connection terminal;
   a wiring board mounted with the digital semiconductor element and the analog semiconductor element; and
   a plurality of external terminals connected to the wiring board,
   wherein the wiring board includes an EBG (Electromagnetic Band Gap) layer formed by arranging a plurality of unit wiring patterns each of which is composed of two wiring patterns having different impedances over a flat plane, a ground layer, a power layer for a digital element connected to one end of the EBG layer, and a power layer for an analog element connected to the other end of the EBG layer,
   wherein the ground connection terminal for the digital semiconductor element and the ground connection terminal for the analog semiconductor element are connected to the ground layer of the wiring board,
   wherein the power connection terminal for the digital semiconductor element is connected to the power layer for the digital element of the wiring board, and
   wherein the power connection terminal for the analog semiconductor element is connected to the power layer for analog element of the wiring board.

2. The semiconductor device according to claim 1,
   wherein the ground layer of the wiring board is disposed in a layer between the power layer for the analog element and the EBG layer, and the analog semiconductor element is disposed nearer to the power layer for the analog element than the EBG layer.

3. The semiconductor device according to claim 1,
   wherein the power layer for the analog element of the wiring board is connected to one of the external terminals via the EBG layer and the power layer for the digital element is connected to another one of the external terminals directly without interposition of the EBG layer.

4. The semiconductor device according to claim 1,
   wherein the power layer for the analog element and the power layer for the digital element of the wiring board are disposed in the same wiring layer, an interval of 1 mm or more is provided between the power layer for the analog element and the power layer for the digital element, and the power layer for the analog element and the EBG layer are connected via viahole connection and lead wire connection.

5. The semiconductor device according to claim 1,
   wherein the analog semiconductor element is connected to the wiring board in a flip-chip manner using the power connection terminal of the analog semiconductor element and the ground connection terminal of the analog semiconductor element, the digital semiconductor element is stacked over the analog semiconductor element, and the power connection terminal and the ground connection terminal of the digital semiconductor element are connected to the power layer for the digital element and the ground layer of the wiring board via bonding wires respectively.

6. A semiconductor device comprising:
   a digital semiconductor element connected with a power connection terminal and a ground connection terminal;
   an analog semiconductor element connected with a power connection terminal and a ground connection terminal;
   a wiring board mounted with the digital semiconductor element and the analog semiconductor element; and
   a plurality of external terminals connected to the wiring board,
   wherein the wiring board includes an EBG (Electromagnetic Band Gap) layer formed by arranging a plurality of unit wiring patterns each of which is composed of two wiring patterns having different area regularly over a flat plane, a ground layer, a power layer for a digital element connected to one end of the EBG layer, and a power layer for a analog element connected to the other end of the EBG layer,
   wherein the ground connection terminal for the digital semiconductor element and the ground connection terminal for the analog semiconductor element are connected to the ground layer of the wiring board,
   wherein the power connection terminal for the digital semiconductor element is connected to the power layer for the digital element of the wiring board, and
   wherein the power connection terminal for the analog semiconductor element is connected to the power layer for the analog element of the wiring board.

7. The semiconductor device according to claim 6,
   wherein the ground layer of the wiring board is disposed in a layer between the power layer for the analog element and the EBG layer, and the analog semiconductor element is disposed nearer to the power layer for the analog element than the EBG layer.

8. The semiconductor device according to claim 6,
   wherein the wiring board further includes a signal layer for the analog element connecting a signal connection terminal for the analog semiconductor element and an external terminal for an analog signal and the signal layer for the analog element is disposed between the analog semiconductor element and the power layer for the analog element.

9. The semiconductor device according to claim 6,
   wherein the power layer for the analog element and the power layer for the digital element of the wiring board are disposed in the same wiring layer and an interval of 1 mm or more is provided between the power layer for the analog element and the power layer for the digital element.

10. The semiconductor device according to claim 6,
    wherein the power layer for the analog element and the EBG layer of the wiring board are connected via viahole connection and lead wire connection.

* * * * *